(12) United States Patent
Noh et al.

(10) Patent No.: US 10,783,820 B2
(45) Date of Patent: Sep. 22, 2020

(54) GATE DRIVER AND FLAT PANEL DISPLAY DEVICE INCLUDING THE SAME

(71) Applicant: LG Display Co., Ltd., Seoul (KR)

(72) Inventors: Seok Noh, Taean-gun (KR); Hae-Jin Park, Goryeong-gun (KR); Ki-Min Son, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 14 days.

(21) Appl. No.: 16/136,683

(22) Filed: Sep. 20, 2018

(65) Prior Publication Data

US 2019/0103049 A1 Apr. 4, 2019

(30) Foreign Application Priority Data

Sep. 29, 2017 (KR) .................. 10-2017-0127630

(51) Int. Cl.
| | |
|---|---|
| G09G 3/36 | (2006.01) |
| G09G 3/20 | (2006.01) |
| H03K 17/687 | (2006.01) |
| G09G 3/3266 | (2016.01) |
| G11C 19/28 | (2006.01) |
| H03K 17/16 | (2006.01) |

(52) U.S. Cl.
CPC .......... *G09G 3/2092* (2013.01); *G09G 3/20* (2013.01); *G09G 3/3266* (2013.01); *G09G 3/3677* (2013.01); *G11C 19/28* (2013.01); *H03K 17/162* (2013.01); *H03K 17/6871* (2013.01); *G09G 2300/0465* (2013.01); *G09G 2310/0267* (2013.01); *G09G 2310/0286* (2013.01); *G09G 2310/0291* (2013.01); *G09G 2310/08* (2013.01)

(58) Field of Classification Search
CPC ........................ H03K 17/162; G09G 3/3266
USPC ............................................ 315/161; 345/99
See application file for complete search history.

(56) References Cited

U.S. PATENT DOCUMENTS

| | | | | |
|---|---|---|---|---|
| 2015/0187298 A1* | 7/2015 | Eom | ................... | G09G 3/3266 345/99 |
| 2015/0263722 A1* | 9/2015 | Kim | ................... | H03K 17/162 315/161 |

* cited by examiner

*Primary Examiner* — Abdul-Samad A Adediran
(74) *Attorney, Agent, or Firm* — Seed Intellectual Property Law Group LLP

(57) ABSTRACT

Disclosed herein are a gate driver capable of implementing a narrow bezel by deleting dummy gate-in-panels (GIPs) and a flat panel display device including the same. The gate driver includes gate-in-panels (GIPs) equal in number to a plurality of gate lines in order to sequentially supply scan pulses to the plurality of gate lines. A k-th GIP is enabled by a carry pulse from a GIP of a (k−a)-th stage and is disabled by a carry pulse output from a GIP of a (k+b)-th stage (a and b are natural numbers), first a GIPs are enabled by a gate start signal output from a timing controller, and last b GIPs are disabled by a reset signal output from the timing controller.

13 Claims, 15 Drawing Sheets

GATE DRIVER AND FLAT PANEL DISPLAY DEVICE INCLUDING THE SAME

CROSS-REFERENCE TO RELATED APPLICATION(S)

This application claims the benefit of Korean Patent Application No. 10-2017-0127630, filed on Sep. 29, 2017, which is hereby incorporated by reference as if fully set forth herein.

BACKGROUND

Technical Field

The present disclosure relates to a gate driver of a display device and, more particularly, to a gate driver capable of implementing a narrow bezel, and a flat panel display device including the same.

Description of the Related Art

With development of information-oriented society and development of various portable electronic apparatuses such as mobile communication terminals and laptops, demand for flat panel display devices has gradually increased.

As a flat panel display device, a liquid crystal display (LCD) device using liquid crystal and an organic light emitting diode (OLED) display device using an OLED are used.

Such a flat panel display device includes a display panel including a plurality of gate lines and a plurality of data lines to display an image, and a driver for driving the display panel.

The driver includes a gate driver for driving the plurality of gate lines, a data driver for driving the plurality of data lines, and a timing controller supplying image data and various control signals to the gate driver and the data driver.

The display panel is defined by an active area A/A for displaying an image to a user and a non-active area N/A which is a peripheral area of the active area A/A.

In addition, the gate driver and the data driver are provided in the non-active area or outside the display panel in order to provide scan pulses and data signals for driving the plurality of gate lines and the plurality of data lines of the display panel and the pixels.

The gate driver may be composed of at least one gate drive IC or may be simultaneously formed in a non-active area NA of the display panel in a process of forming the plurality of signal lines (the gate lines and the data lines) and sub-pixels of the display panel. As a result, the gate driver is included in the display panel. This is referred to as a gate-in-panel (GIP).

The gate driver includes a plurality of stages (hereinafter referred to as GIPs) greater in number than the number of gate lines, in order to sequentially supply scan pulses to the gate lines.

That is, if the number of gate lines is n, the number of GIPs is greater than n.

FIG. 1 is a view showing the configuration of a conventional gate driver (GIP) driven in six phases.

Although not shown in the figure, each stage (GIP) includes a node controller for controlling a Q node and a Qb node according to a set signal and a reset signal, a scan pulse output terminal for outputting an input clock signal as a scan pulse according to voltages of the Q node and the Qb node, and a carry pulse output terminal for outputting an input clock signal as a carry pulse according to the voltages of the Q node and the Qb node.

Here, the set signal is a carry pulse output from a third previous stage (GIP) or a start signal VST output from the timing controller and the reset signal is a carry pulse output from a third next stage (GIP) or a reset signal RST output from the timing controller.

Accordingly, as shown in FIG. 1, in the conventional gate driver, if n gate lines are disposed in the active area A/A of the display panel, n A/A GIPs GIP(1) to GIP(n) for sequentially supplying the scan signals to the n gate lines provided in the active area A/A of the display panel and dummy GIPs DGIP(1) to DGIP(6) provided at the front and back sides of the n A/A GIPs GIP(1) to GIP(n) are included. The dummy GIPs DGIP(1) to DGIP(6) do not supply the scan pulses to the n gate lines provided in the active area A/A of the display panel.

The dummy GIPs DGIP(1) to DGIP(3) provided at the front side of the n A/A GIP GIP(1) to GIP(n) generate carry pulses DCP(1), DCP(2) and DCP(3) by the start signal VST output from the timing controller and output the carry pulses as set signals for enabling the first to third GIPs GIP(1), GIP(2) and GIP(3) among the A/A GIPs GIP(1) to GIP(n).

In addition, the dummy GIPs DGIP(1) to DGIP(3) are reset (disabled) by the carry pulses CP(1), CP(2) and CP(3) output from the first to third GIPs GIP(1), GIP(2) and GIP(3) among the A/A GIPs GIP(1) to GIP(n).

Meanwhile, the dummy GIPs DGIP(4) to DGIP(6) provided at the back side of the n A/A GIP GIP(1) to GIP(n) are enabled by the carry pulses CP(n-2), CP(n-1) and CP(n) output from the last three GIPs GIP(n-2), GIP(n-1) and GIP(n) among the A/A GIPs GIP(1) to GIP(n) to generate carry pulses DCP(4), DCP(5) and DCP(6) and output the carry pulses as reset signals for disabling the last three GIPs GIP(n-2), GIP(n-1) and GIP(n) among the A/A GIPs GIP(1) to GIP(n).

The dummy GIPs DGIP(4) to DGIP(6) provided at the back side of the n A/A GIP GIP(1) to GIP(n) are disabled (reset) by the reset signal RST output from the timing controller.

In the conventional gate driver, presence of the dummy GIPs which do not supply the scan pulses to the gate lines provided in the active area A/A of the display panel increases the bezel size of the display device.

BRIEF SUMMARY

Accordingly, in various embodiments, the present disclosure is directed to a gate driver of a display device that substantially obviates one or more problems due to limitations and disadvantages of the related art.

In one or more embodiments, the present disclosure provides a gate driver capable of reducing a bezel size by deleting dummy gate-in-panels (GIPs) of a gate driver, and a flat panel display device including the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a gate driver includes gate-in-panels (GIPs) equal in number to a plurality of gate lines in order to sequentially supply scan pulses to the plurality of gate lines. A k-th GIP is enabled by a carry pulse from a (k−n)-th GIP and is disabled by a carry pulse output from a (k+m)-th GIP (n and m being natural numbers), first n GIPs are enabled by a gate start signal output from a timing controller, and last m GIPs are disabled by a reset signal output from the timing controller.

In the gate driver according to the first embodiment of the present disclosure, the first GIP comprises: a blank-time node controller for selectively storing the carry pulse according to a line select signal, and charging a first node with a first constant voltage and discharging a second node with a second constant voltage according to a real-time compensation signal, at a blank time; a driving-time node controller for charging the first node with a voltage of the gate start signal and discharging the second node with the second constant voltage according to the gate start signal, discharging the first node and a third node with the second constant voltage according to a carry pulse of a m-th next GIP and charging the third node with the first constant voltage according to a voltage of the first node, at a driving time; an inverter for inverting the voltage of the first node and applying the inverted voltage to the second node; an output buffer for receiving one of a plurality of carry pulse output clock signals and one of a plurality of scan pulse output clock signals and outputting a carry pulse and a scan pulse according to the voltages of the first node and the second node; and a reset unit for discharging the first node with the second constant voltage according to the reset signal output from the timing controller at the blank time.

In the gate driver according to the first embodiment of the present disclosure, the last GIP comprises: a blank-time node controller for selectively storing the carry pulse according to a line select signal, and charging a first node with a first constant voltage and discharging a second node with a second constant voltage according to a real-time compensation signal, at a blank time; a driving-time node controller for charging the first node with a voltage of a carry pulse output from n-th previous GIP and discharging the second node with the second constant voltage according to the carry pulse output from the n-th previous GIP, discharging the first node and a third node with the second constant voltage according to the reset signal output from the timing controller, and charging the third node with the first constant voltage according to a voltage of the first node, at a driving time; an inverter for inverting the voltage of the first node and applying the inverted voltage to the second node; an output buffer for receiving one of a plurality of carry pulse output clock signals and one of a plurality of scan pulse output clock signals and outputting a carry pulse and a scan pulse according to the voltages of the first node and the second node; and a reset unit for discharging the first node with the second constant voltage according to the reset signal output from the timing controller at the blank time.

In the gate driver according to the first embodiment of the present disclosure, a k-th GIP comprises: a blank-time node controller for selectively storing the carry pulse according to a line select signal, and charging a first node with a first constant voltage and discharging a second node with a second constant voltage according to a real-time compensation signal, at a blank time; a driving-time node controller for charging the first node with a voltage of a carry pulse output from a (k−n)-th GIP and discharging the second node with the second constant voltage according to the carry pulse output from the (k−n)-th GIP, discharging the first node and a third node with the second constant voltage according to a carry pulse output from a (k+m)-th GIP, and charging the third node with the first constant voltage according to a voltage of the first node, at a driving time; an inverter for inverting the voltage of the first node and applying the inverted voltage to the second node; an output buffer for receiving one of a plurality of carry pulse output clock signals and one of a plurality of scan pulse output clock signals and outputting a carry pulse and a scan pulse according to the voltages of the first node and the second node; and a reset unit for discharging the first node with the second constant voltage according to the reset signal output from the timing controller at the blank time.

In the gate driver according to the first embodiment of the present disclosure, all GIPs have the same circuit configuration.

In the gate driver according to the first embodiment of the present disclosure, enable timing of the real-time compensation signal is delayed relative to enable timing of the reset signal at the blank time.

In the gate driver according to the second embodiment of the present disclosure, the first GIP comprises: a blank-time node controller for selectively storing the carry pulse according to a line select signal, and charging a first node with a first constant voltage and discharging a second node with a second constant voltage according to a real-time compensation signal, at a blank time; a driving-time node controller for charging the first node with a voltage of the gate start signal and discharging the second node with the second constant voltage according to the gate start signal, discharging the first node and a third node with the second constant voltage according to a carry pulse of a m-th next GIP, and charging the third node with the first constant voltage according to a voltage of the first node, at a driving time; an inverter for inverting the voltage of the first node and applying the inverted voltage to the second node; and an output buffer for receiving one of a plurality of carry pulse output clock signals and one of a plurality of scan pulse output clock signals and outputting a carry pulse and a scan pulse according to the voltages of the first node and the second node.

In the gate driver according to the second embodiment of the present disclosure, the last GIP comprises: a blank-time node controller for selectively storing the carry pulse according to a line select signal, and charging a first node with a first constant voltage and discharging a second node with a second constant voltage according to a real-time compensation signal, at a blank time; a driving-time node controller for charging the first node with a voltage of a carry pulse from a n-th previous GIP and discharging the second node with the second constant voltage according to the carry pulse output from the n-th previous GIP, discharging the first node and a third node with the second constant voltage according to the reset signal output from the timing controller, and charging the third node with the first constant voltage according to a voltage of the first node, at a driving time; an inverter for inverting the voltage of the first node and applying the inverted voltage to the second node; an output buffer for receiving one of a plurality of carry pulse output clock signals and one of a plurality of scan pulse output clock signals and outputting a carry pulse and a scan pulse according to the voltages of the first node and the second node; and a reset unit for discharging the first node with the second constant voltage according to the gate start signal output from the timing controller at the blank time.

In the gate driver according to the second embodiment of the present disclosure, a k-th GIP comprises: a blank-time node controller for selectively storing the carry pulse according to a line select signal, and charging a first node with a first constant voltage and discharging a second node with a second constant voltage according to a real-time compensation signal, at a blank time; a driving-time node controller for charging the first node with a voltage of a carry pulse output from a (k−n)-th GIP and discharging the second node with the second constant voltage according to the carry pulse output from the (k−n)-th GIP, discharging the first node and a third node with the second constant voltage according to a carry pulse of a (k+m)GIP, and charging the third node with the first constant voltage according to a voltage of the first node, at a driving time; an inverter for inverting the voltage of the first node and applying the inverted voltage to the second node; an output buffer for receiving one of a plurality of carry pulse output clock signals and one of a plurality of scan pulse output clock signals and outputting a carry pulse and a scan pulse according to the voltages of the first node and the second node; and a reset unit for discharging the first node with the second constant voltage according to the gate start signal output from the timing controller at the blank time.

In the gate driver according to the second embodiment of the present disclosure, first n GIPs have a circuit configuration different from those of the remaining GIPs.

In the gate driver according to the second embodiment of the present disclosure, the reset signal and the real-time compensation signal are simultaneously enabled at the blank time.

According to another aspect of the present disclosure, a flat panel display device includes a display panel including a plurality of gate and data lines and a plurality of sub-pixels formed in a matrix to supply data voltages to the plurality of data lines in response to scan pulses supplied to the gate lines to display an image, a gate driver for sequentially supplying the scan pulses to the gate lines, a data driver for supplying the data voltages to the plurality of data lines, and a timing controller for respectively supplying a plurality of gate control signals and a plurality of data control signals to the gate driver and the data driver.

The gate driver includes GIPs equal in number to the gate lines.

A k-th GIP is enabled by a carry pulse output from a (k−n)-th GIP and is disabled by a carry pulse output from a (k+m)-th GIP (n and m are natural numbers), first n GIPs are enabled by a gate start signal output from the timing controller, and last m GIPs are disabled by a reset signal output from the timing controller.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

The gate driver and the flat panel display device including the same according to the present disclosure having the above-described features will be described in greater detail with reference to the accompanying drawings.

Figure 1:
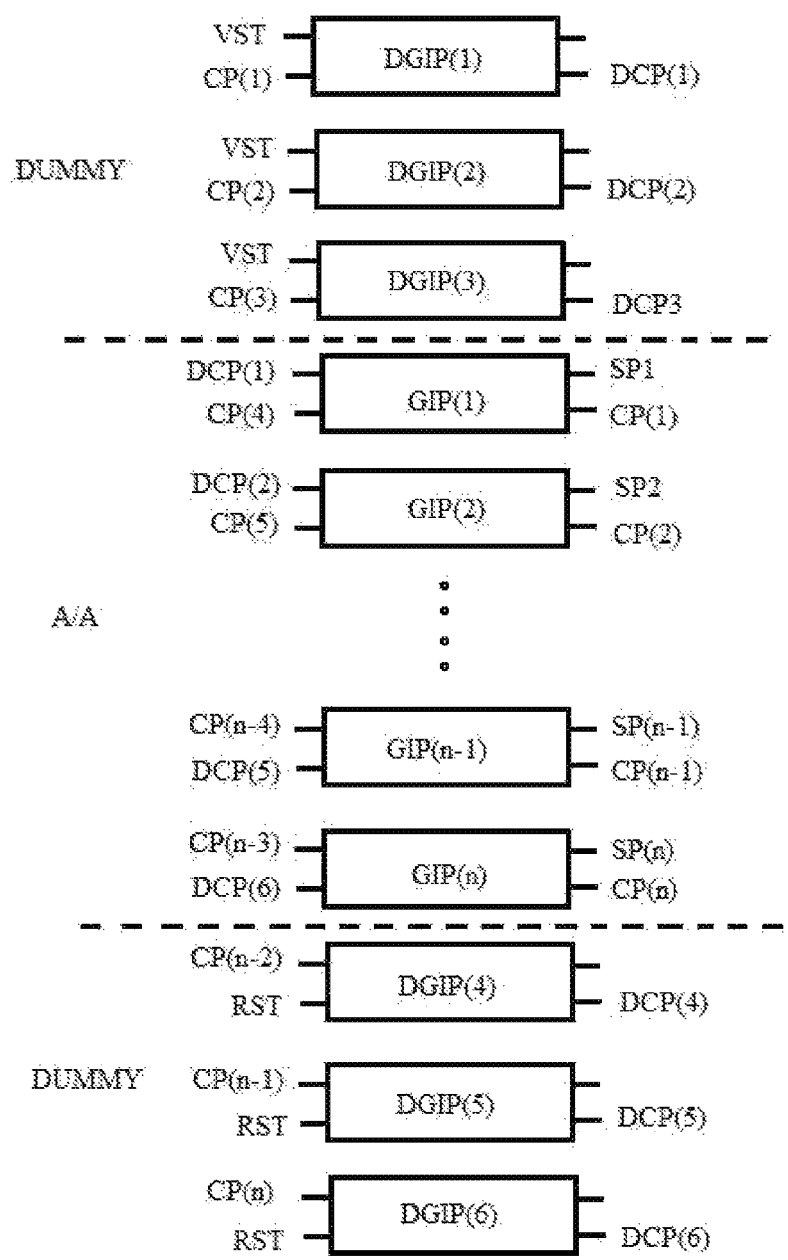
FIG. 1 is a diagram showing the configuration of a conventional gate driver driven in six phases.
Figure 2:
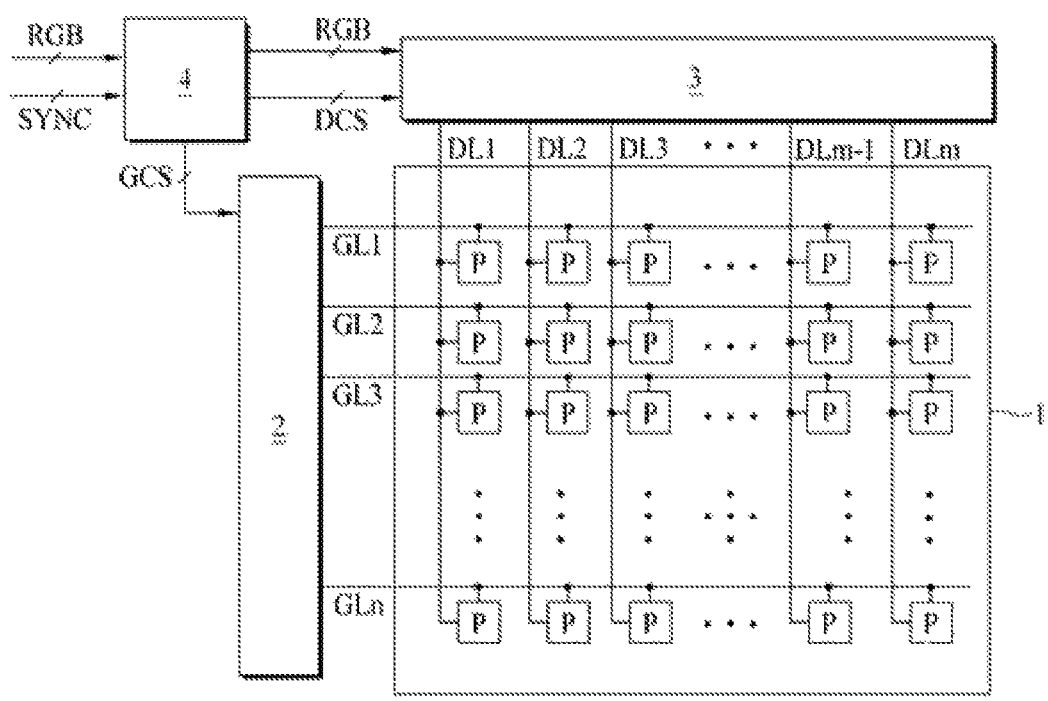
FIG. 2 is a diagram schematically showing a flat panel display device according to an embodiment of the present disclosure.

FIG. 2 is a diagram schematically showing a flat panel display device according to an embodiment of the present disclosure.

The flat panel display device according to the present disclosure includes a display panel 1, a gate driver 2, a data driver 3 and a timing controller 4.

On the display panel 1, a plurality of gate lines GL and a plurality of data lines DL are disposed and a plurality of sub-pixels P is arranged at intersections between the plurality of gate lines GL and the plurality of data lines DL in a matrix. The plurality of sub-pixels P displays an image according to image signals (data voltages) received from the plurality of data lines DL in response to scan pulses G received from the gate lines GL.

If the display panel 1 is a display panel (liquid crystal display panel) of a liquid crystal display device, the liquid crystal display panel includes a thin-film transistor array substrate in which a thin-film transistor array is formed on a glass substrate, a color filter array substrate in which a color filter array is formed on a glass substrate, and a liquid crystal layer filled between the thin-film transistor array substrate and the color filter array substrate.

The thin-film transistor array substrate includes a plurality of gate lines GL extending in a first direction and a plurality of data lines DL extending in a second direction perpendicular to the first direction, and a sub-pixel area P is defined by each gate line and each data line a thin-film transistor and a pixel electrode are formed in the sub-pixel area P.

The liquid crystal panel applies a voltage to an electric-field generation electrode (pixel electrode and common electrode) to generate an electric field in the liquid crystal layer and adjusts alignment of liquid crystal molecules of the liquid crystal layer by the electric field to control polarization of incident light, thereby displaying an image.

In addition, if the display panel 1 is a display panel (OLED display panel) of an OLED display device, the OLED display panel includes sub-pixels defined by intersections between the plurality of gate lines and the plurality of data lines, and each sub-pixel includes an OLED composed of an anode, a cathode and an organic light emitting layer between the anode and the cathode, and a pixel circuit for independently driving the OLED.

The pixel circuit may be variously configured and includes at least one switching TFT, a capacitor and a driving TFT.

The at least one switching TFT charges the capacitor with the data voltage in response to the scan pulse. The driving TFT controls the amount of current supplied to the OLED according to the data voltage charged in the capacitor to adjust the amount of light emitted from the OLED.

The display panel 1 is defined by an active area A/A for displaying an image to a user and a non-active area N/A which is a peripheral area of the active area A/A.

The gate driver 2 is a gate-in-panel (GIP) type gate driver and is disposed in the non-active area of the display panel 1.

The gate driver 2 includes a gate shift register for sequentially supplying the scan pulse (gate driving signal) SP to each gate line GL according to a plurality of gate control signals GCS received from the timing controller 4.

The plurality of gate control signals GCS includes a plurality of clock signals CLK1-8 having different phases, a gate start signal VST indicating driving start of the gate driver 2, a reset signal RST, a line select pulse LSP, gate high voltages VGH and GVDD and gate low voltages VGL, GVSS0, GVSS1 and GVSS2.

The data driver 3 converts digital image data RGB received from the timing controller 4 into an analog data voltage using a reference gamma voltage and supplies the converted analog data voltage to the plurality of data lines DL. The data driver 3 is controlled according to a plurality of data control signals DCS received from the timing controller 4.

The timing controller 4 aligns the image data RGB received from the outside according to the size and resolution of the display panel 1 and supplies the image data to the data driver 3. In addition, the timing controller 4 generates a plurality of gate control signals GCS and a plurality of data control signals DCS using synchronization signals SYNC received from the outside, such as a dot clock DCLK, a data enable signal DE, a horizontal synchronization signal Hsync and a vertical synchronization signal Vsync and respectively supplies the gate control signals and the data control signals to the gate driver 2 and the data driver 3.

The gate driver 2 includes a plurality of stages (GIPs) in order to sequentially supply the scan pulse (gate driving signal) SP(n) to each of the plurality of gate lines GL.

The gate driver 2 according to the present disclosure does not include the dummy GIPs of the conventional gate driver.

That is, if n gate lines are provided in the active area A/A of the display panel 1, the gate driver 2 according to the present disclosure includes only n GIPs.

Figure 3:
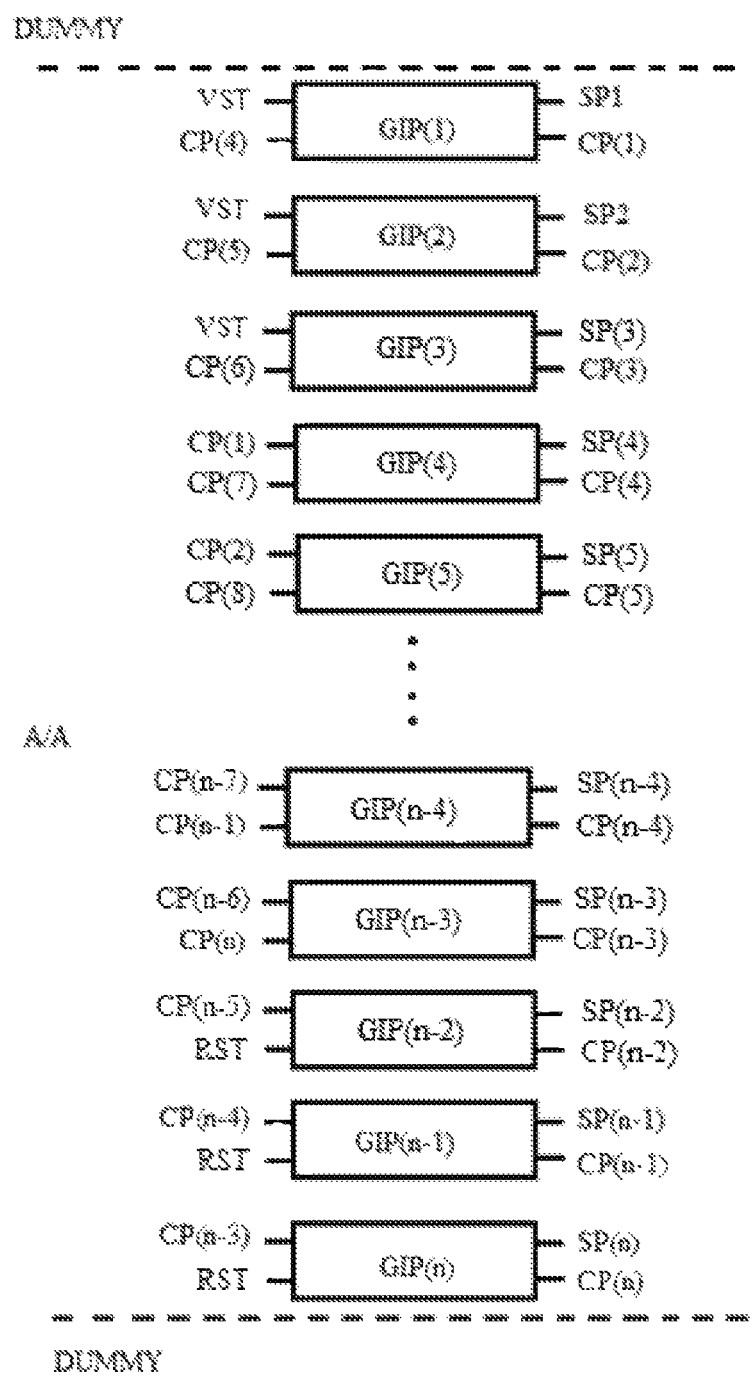
FIG. 3 is a diagram showing a gate driver according to the present disclosure.

FIG. 3 is a diagram showing a gate driver according to the present disclosure.

As shown in FIG. 3, the gate driver 2 according to the present disclosure includes a plurality of stages GIPs connected in cascade. Each GIP is connected to one gate line GL to sequentially generate a scan pulse SP and a carry pulse CP according to the clock signals SCCLKs and CRCLKs and the gate control signals GCS received from the timing controller 4 and to output the scan pulse SP to the corresponding gate line and to output the carry pulse CP as reset and set signals of the GIPs of the previous and next stages.

If n gate lines are provided in the active area A/A of the display panel 1, the gate driver 2 according to the present disclosure includes only n GIPs GIP(1) to GIP(n), as shown in FIG. 3.

The circuit configuration of each of the GIPs GIP(1) to GIP(n) is different from that of the conventional GIP.

FIG. 3 shows the gate driver 2 driven in six phases. Accordingly, first to third GIPs GIP(1) to GIP(3) are enabled (set) by the gate start signal VST output from the timing controller 4 and are disabled (reset) by carry pulses CP(4), CP(5) and CP(6) output from GIPs GIP(4), GIP(5) and GIP(6) of the third next stages.

Last three GIPs GIP(n), GIP(n-1) and GIP(n-2) are enabled (set) by the carry pulses CP(n-3), CP(n-4) and CP(n-5) output from GIPs GIP(n-3), GIP(n-4) and GIP(n-5) of the third previous stages and are disabled (reset) by the reset signal RST output from the timing controller 4.

The remaining GIPs GIP(4) to GIP(n-3) are enabled (set) by the carry pulses CP(1) to CP(n-6) output from the GIPs GIP(1) to GIP(n-6) of the third previous stages, and are disabled (reset) by the carry pulses CP(7) to CP(n) output from the GIPs GIP(7) to GIP(n) of the third next stages.

Here, the gate start signal VST is simultaneously applied to the first to third GIPs GIP(1) to GIP(3) and the reset signal RST is simultaneously applied to the last three GIPs GIP(n), GIP(n-1) and GIP(n-2).

Although the first to third GIPs GIP(1) to GIP(3) are enabled (set) by the gate start signal VST output from the timing controller 4 and the last three GIPs GIP(n), GIP(n-1) and GIP(n-2) are disabled (reset) by the reset signal RST output from the timing controller 4 in FIG. 3, the present disclosure is not limited thereto and may be variously configured.

That is, although not shown in the figure, only the first and second GIPs GIP(1) and GIP(2) may be enabled (set) by the gate start signal VST output from the timing controller 4, only the last two GIPs GIP(n) and GIP(n-1) may be disabled (reset) by the reset signal output from the timing controller 4, and the remaining GIPs GIP(3) to GIP(n-2) may be enabled (set) by the carry pulses CP(1) to CP(n-4) output from the GIPs GIP(1) to GIP(n-4) of the second previous stages and may be disabled (reset) by the carry pulses CP(5) to CP(n) output from the GIPs GIP(5) to GIP(n) of the second next stages.

That is, only the first and second GIPs GIP(1) and GIP(2) may be enabled (set) by the gate start signal VST output from the timing controller 4 and may be disabled (reset) by the carry pulses CP(3) and CP(4) output from the GIPs GIP(3) and GIP(4) of the second next stages.

In addition, the last two GIPs GIP(n) and GIP(n-1) may be enabled (set) by the carry pulses CP(n-2) and CP(n-3) output from the GIPs GIP(n-2) and GIP(n-3) of the second previous stages and may be disabled (reset) by the reset signal output from the timing controller 4.

In addition, as another method, only the first GIP GIP(1) may be enabled (set) by the gate start signal VST output from the timing controller 4, only the last GIP GIP(n) may be disabled (reset) by the reset signal RST output from the timing controller 4, and the remaining GIPs GIP(2) to GIP(n-1) may be respectively enabled (set) by the carry pulses CP(1) to CP(n-2) output from the GIPs GIP(1) to GIP(n-2) of the first previous stage and may be respectively disabled (reset) by the carry pulses CP(3) to CP(n) output from the GIPs GIP(3) to GIP(n) of the first next stages.

That is, only the first GIP GIP(1) may be enabled (set) by the gate start signal VST output from the timing controller 4 and may be disabled (reset) by the carry pulse CP(2) output from the GIP GIP(2) of the next stage.

In addition, the last GIP GIP(n) may be enabled (set) by the carry pulse CP(n-1) output from the GIP GIP(n-1) of the previous stage and may be disabled (reset) by the reset signal RST output from the timing controller 4.

In addition, as another method, only the first to third GIPs GIP(1) and GIP(3) may be enabled (set) by the gate start signal VST output from the timing controller 4 and only last two GIPs GIP(n) to GIP(n-1) may be disabled (reset) by the reset signal RST output from the timing controller 4.

The remaining GIPs GIP(4) to GIP(n-2) may be enabled (set) by the carry pulses CP(1) to CP(n-5) output from the GIPs GIP(1) to GIP(n-5) of the third previous stages and may be disabled (reset) by the carry pulses CP(6) to CP(n) output from the GIPs GIP(6) to GIP(n) of the second next stages.

In addition, as another method, only the first and second GIPs GIP(1) and GIP(2) may be enabled (set) by the gate start signal VST output from the timing controller 4, the last three GIPs GIP(n), GIP(n-1) and GIP(n-2) may be disabled (reset) by the reset signal RST output from the timing controller 4, and the remaining GIPs GIP(3) to GIP(n-3) may be respectively enabled (set) by the carry pulses CP(1) to CP(n-5) output from the GIPs GIP(1) to GIP(n-5) of the second previous stages and may be respectively disabled (reset) by the carry pulses CP(6) to CP(n) output from the GIPs GIP(6) to GIP(n) of the third next stages.

That is, various configurations are possible depending on how many GIPs from the first GIP are enabled by the gate start signal VST output from the timing controller 4 and how many GIPs from the last GIP are disabled by the reset signal RST output from the timing controller 4.

For example, when the number of GIPs enabled by the gate start signal VST output from the timing controller 4 is n and the number of GIPs disabled by the reset signal RST output from the timing controller 4 is m, a k-th GIP GIP(k) is enabled by the carry pulse CP(k−n) output from the GIP GIP(k−n) of a (k−n)-th previous stage and is disabled by the carry pulse CP(k+m) output from the GIP GIP(k+m) of a (k+m)-th next stage.

Figure 4:
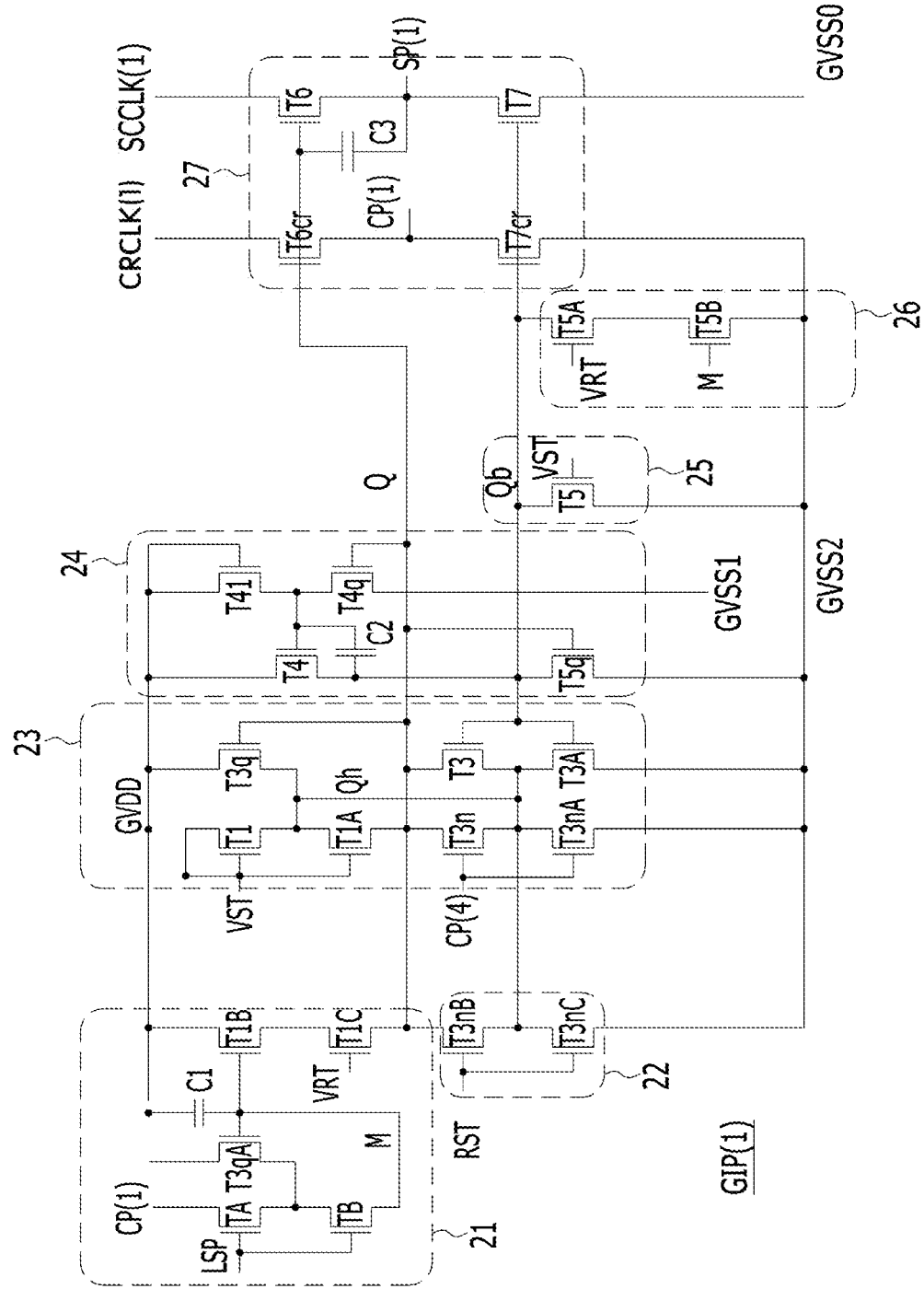
FIG. 4 is a circuit diagram of a first GIP of a gate driver according to a first embodiment of the present disclosure.
Figure 5:
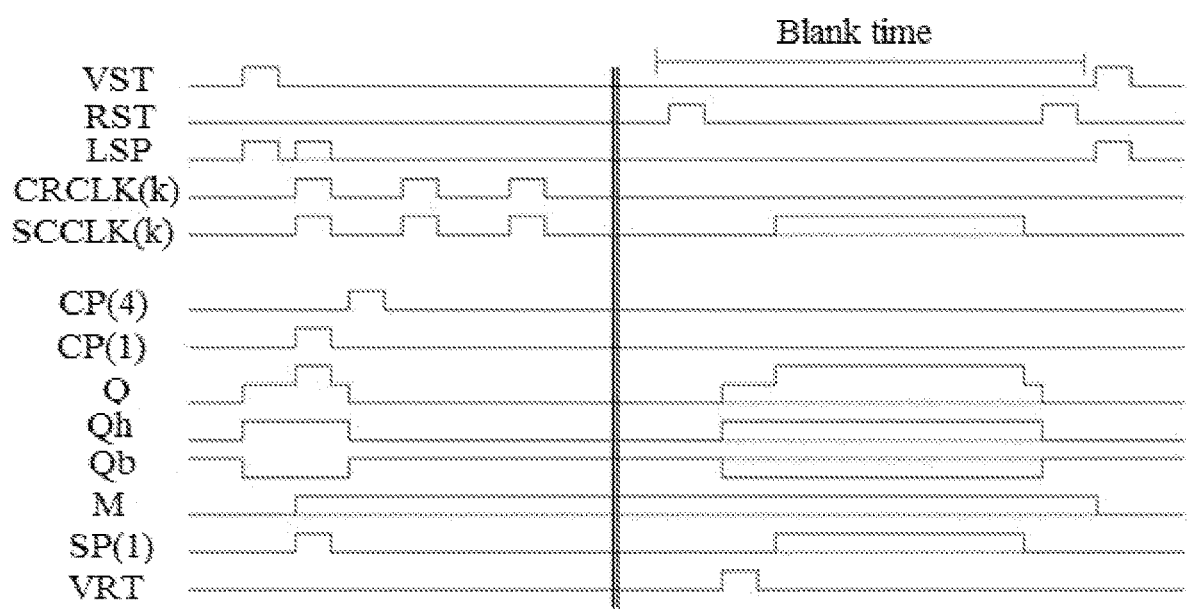
FIG. 5 is a timing chart of the operation of the GIP circuit of FIG. 4.

FIG. 4 is a circuit diagram of a first GIP of a gate driver according to a first embodiment of the present disclosure, and FIG. 5 is a timing chart of the operation of the GIP circuit of FIG. 4.

That is, FIG. 4 is a circuit diagram of a first GIP of the gate driver driven in six phases and FIG. 5 is a timing chart of the operation of the GIP.

As shown in FIG. 4, the first GIP GIP(1) of the gate driver according to the embodiment of the present disclosure includes blank-time node controllers 21 and 26 including transistors TA, TB, T3qA, T1B, T1C, T5A and T5B and a capacitor C1 to selectively store a carry pulse CP(1) in the capacitor C1 according to a line select signal (LSP) and to charge a first node Q of a corresponding stage with a first constant voltage GVDD and discharge a second node Qb with a second constant voltage GVSS2 according to a real-time compensation signal VRT (vertical real time) and the carry pulse CP(1) stored in the capacitor C1 at a blank time; driving-time node controllers 23 and 25 including transistors T1, T1A, T3n, T3nA, T3q, T3, T3A and T5 to charge the first node Q of the corresponding stage with a gate start signal VST according to the gate start signal VST at a driving time, to discharge the first node Q and a third node Qh with a second constant voltage GVSS2 according to the carry pulse CP4 of the third next stage, to discharge the second node Qb with the second constant voltage GVSS2 according to the gate start signal VST, and to charge the third node Qh with the first constant voltage GVDD according to the voltage of the first node Q; an inverter 24 including transistors T4, T41, T4q and T5q and a capacitor C2 to invert the voltage of the first node Q and to apply the inverted voltage to the second node Qb; an output buffer 27 including pull-up transistors T6cr and T6, pull-down transistors T7cr and T7 and a bootstrapping capacitor C3 to receive one CRCLK(1) of a plurality of carry pulse output clock signals and one SCCLK(1) of a plurality of scan pulse output clock signals and to output a carry pulse CP(1) and a scan pulse SP(1) according to the voltages of the first node Q and the second node Qb; and a reset unit 22 including transistors T3nB and T3nC to discharge the first node Q with the second constant voltage GVSS2 according to a reset signal RST output from the timing controller 4 at the blank time.

In the blank-time node controllers 21 and 26, when the line select signal LSP is at a high level, the transistors TA, TB and T3q are turned on to store the carry pulse CP(1) in the capacitor C1.

When the real-time compensation signal VRT is at a high level at the blank time, the transistors T1C and T5B are turned on to charge the first node Q with the first constant voltage GVDD and to discharge the second node Qb with the second constant voltage GVSS2.

In the driving-time node controllers 23 and 25, when the gate start signal VST is at a high level at the driving time, the transistors T1, T1A and T5 are turned on to charge the first node Q with the voltage of the gate start signal VST and to discharge the second node Qb with the second constant voltage GVSS2. When the first node Q is charged and the second node Qb is discharged, the transistor T3q is turned on to charge the third node Qh with the first constant voltage GVDD.

When the carry pulse CP4 of the third next stage is at a high level, the transistors T3n and T3nA are turned on to discharge the first node Q and the third node Qh with the second constant voltage GVSS2.

The inverter 24 inverts the voltage of the first node Q and applies the inverted voltage to the second node Qb.

In the output buffer 27, when the first node Q is at a high level and the second node Qb is a low level, the pull-up transistor T6cr is turned on and the pull-down transistor T7cr is turned off to output one CRCLK(1) of the plurality of carry pulse output clock signals as the carry pulse CP(1). In addition, when the first node Q is at a high level and the second node Qb is a low level, the pull-up transistor T6 is turned on and the pull-down transistor T7 is turned off to output one SCCLK(1) of the plurality of scan pulse output clock signals as the scan pulse SP(1).

At this time, when the scan pulse output clock signal SCCLK(1) having a high level is applied, the first node Q is bootstrapped (or coupled) by the bootstrapping capacitor C3 of the output buffer 27, thereby having a higher voltage.

In a state in which the first node Q is bootstrapped, the output buffer 27 outputs the carry pulse output clock signal CRCLK(1) and the scan pulse output clock signal SCCLK(1) as the carry pulse CP(1) and the scan pulse SP(1), thereby preventing output loss.

In the reset unit 22, at the blank time, when the reset signal RST output from the timing controller 4 is at a high level, the transistors T3nB and T3nC are turned on to discharge the first node Q with the second constant voltage GVSS2.

The operation of the first GIP GIP(1) of the gate driver according to the embodiment of the present disclosure will be described with reference to FIG. 5.

First, as shown in FIG. 5, the gate start signal VST and the line select signal LSP having a high level are simultaneously input at the beginning of a frame. Accordingly, as described above, by the driving-time node controllers 23 and 25, the first node Q is charged with the voltage of the gate start signal VST, the second node Qb is discharged with the second constant voltage GVSS2, and the third node Qh is charged with the first constant voltage GVDD. In addition, the inverter 24 inverts the voltage of the first node Q and applies the inverted voltage to the second node Qb.

Accordingly, the first node Q and the third node Qh become a high level state and the second node Qb becomes a low level state.

Meanwhile, when the gate start signal VST and the line select signal LSP having a high level are simultaneously input, the transistors TA, TB and T3qA are turned on. At this time, since the carry pulse CP(1) is maintained at the low level, the capacitor C1 is discharged and initialized.

In addition, when the gate start signal VST is at a low level, the carry pulse CP(1) is synchronized and the line select signal LSP having a high level is input again, the transistors TA, TB and T3qA are turned on to charge the capacitor C1 with the carry pulse CP(1). Accordingly, the M node of the blank-time node controllers 21 and 26 is maintained at a high level until a next frame starts.

When the first node Q is at a high level and the second node Qb is at a low level, the pull-up transistor T6cr of the output buffer 27 is turned on and the pull-down transistor T7cr is turned off to output one CRCLK(1) of the plurality of carry pulse output clock signals as the carry pulse CP(1) and the pull-up transistor T6 is turned on and the pull-down transistor T7 is turned off to output one SCCLK(1) of the plurality of scan pulse output clock signals as the scan pulse SP(1).

At this time, when the scan pulse output clock signal SCCLK(1) having a high level is applied, the first node Q is bootstrapped (or coupled) by the bootstrapping capacitor C3 of the output buffer 27, thereby having a higher voltage.

In a state in which the first node Q is bootstrapped, the output buffer 27 outputs the carry pulse output clock signal CRCLK(1) and the scan pulse output clock signal SCCLK(1) as the carry pulse CP(1) and the scan pulse SP(1), thereby preventing output loss.

When the GIP GIP(4) of the third next stage outputs the carry pulse CP(4) having a high level, the transistors T3n and T3nA of the driving-time node controller 23 are turned on to discharge the first node Q and the third node Qh with the second constant voltage GVSS2.

Accordingly, the first node Q and the third node Qh become a low level state and the second node Qb becomes a high level state.

Meanwhile, at the blank time, when the reset signal RST output from the timing controller 4 is at a high level, the transistors T3nB and T3nC of the reset unit 22 are turned on to discharge the first node Q with the second constant voltage GVSS2, thereby performing initialization. At the blank time, when the real-time compensation signal VRT is at a high level, the transistors T1C and T5B of the blank-time node controller 21 and 26 are turned on to charge the first node Q with the first constant voltage GVDD and to discharge the second node Qb with the second constant voltage GVSS2.

Accordingly, at the blank time, the first node Q becomes a high level state and the second node Qb becomes a low level state. At this time, since one SCCLK(1) of the plurality of scan pulse output clock signals having a high level is output, the carry pulse CP(1) is not output but the scan pulse SP(1) is output. This state is maintained until the reset signal having a high level is input. When the reset signal having a high level is input, the transistors T3nB and T3nC of the reset unit 22 are turned on to discharge the first node Q with the second constant voltage GVSS2, thereby performing initialization. Therefore, the first node Q and the third node Qh become a low level state and the second node Qb becomes a high level state.

In a next frame, when the gate start signal VST and the line select signal LSP having a high level are simultaneously input, the capacitor C1 is initialized and the M node is maintained in the low level state.

By this method, real-time compensation is performed at the blank time.

Although the first GIP GIP(1) is described in FIGS. 4 and 5, the second and third GIPs GIP(2) and GIP(3) shown in FIG. 3 have the same circuit configuration and are driven using the same method as the first GIP, except that applied signals are different.

Figure 6:
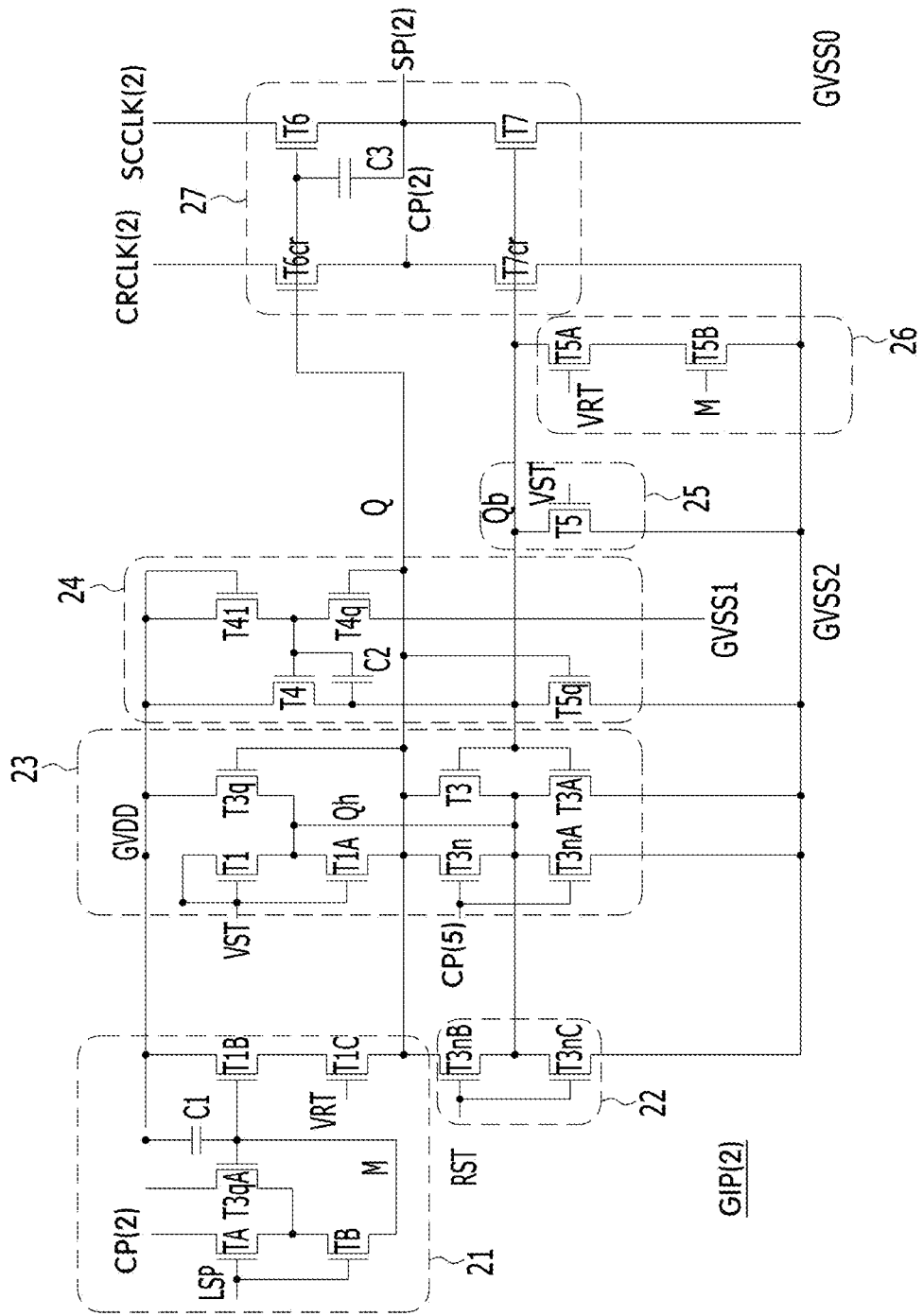
FIG. 6 is a circuit diagram of a second GIP of the gate driver according to the first embodiment of the present disclosure.
Figure 7:
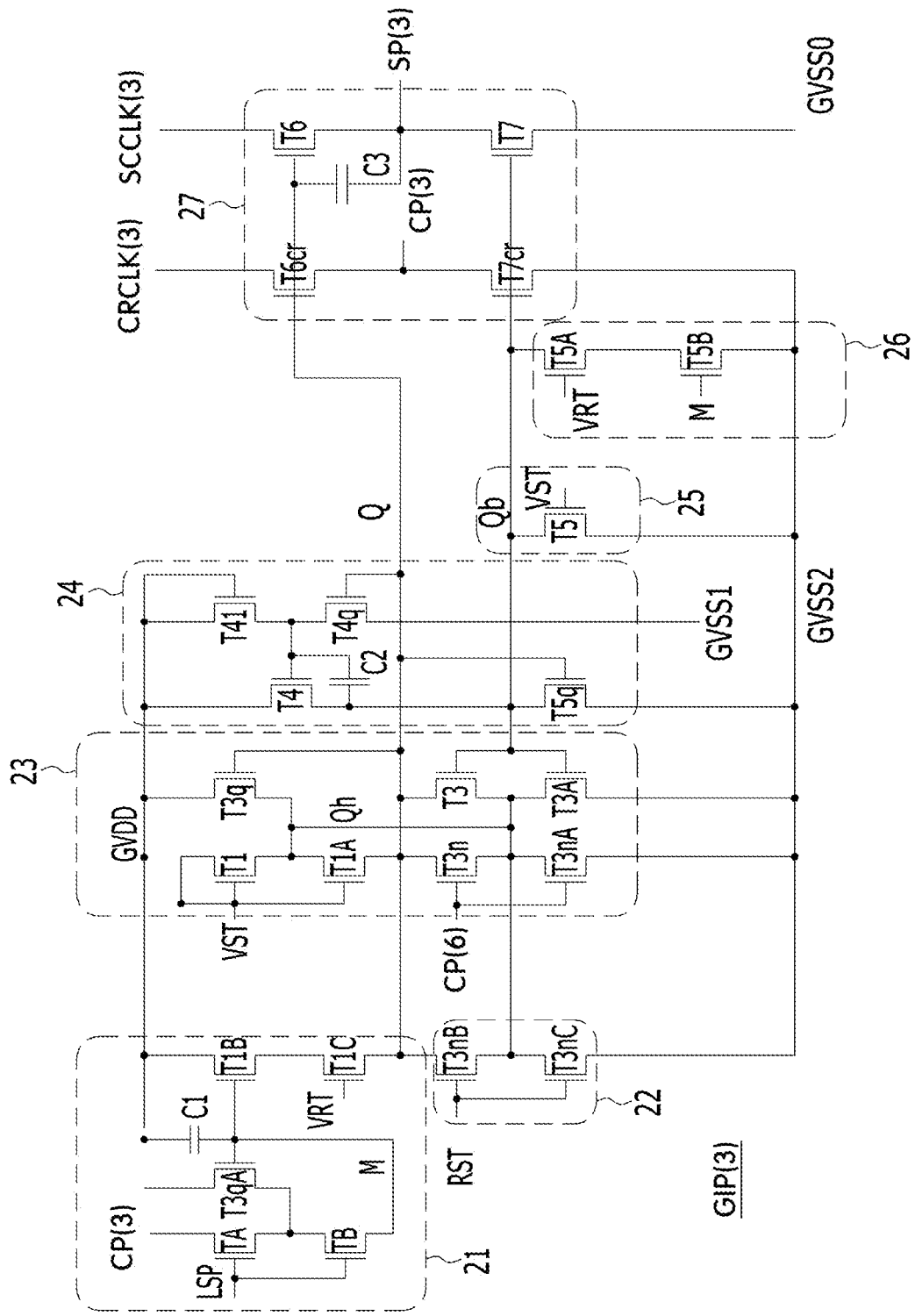
FIG. 7 is a circuit diagram of a third GIP of the gate driver according to the first embodiment of the present disclosure.

FIG. 6 is a circuit diagram of a second GIP of the gate driver according to the first embodiment of the present disclosure, and FIG. 7 is a circuit diagram of a third GIP of the gate driver according to the first embodiment of the present disclosure.

As shown in FIGS. 6 and 7, the second and third GIPs GIP(2) and GIP(3) of the gate driver according to the first embodiment of the present disclosure have the same circuit configuration and are driven using the same method as the first GIP GIP(1) shown in FIG. 4, except that applied signals are different.

That is, there is a difference in the phase of the line select signal LSP applied to the blank-time node controller 21 at a high level when the gate start signal VST is at a low level, and the phase of the carry pulse output clock signal CRCLK(1) and the scan pulse output clock signal SCCLK(1) applied to the output buffer 27.

In addition, there is a difference in the carry pulses of the next stages applied to the transistors T3n and T3nA of the driving-time node controller 23.

That is, the carry pulse output clock signals CRCLK(2) and the scan pulse output clock signal SCCLK(2) applied to the output buffer 27 of the second GIP GIP(2) have phases shifted (delayed) by one clock from the carry pulse output clock signal CRCLK(1) and the scan pulse output clock signal SCCLK(1) applied to the output buffer 27 of the first GIP GIP(1).

In addition, the carry pulse output clock signals CRCLK(3) and the scan pulse output clock signal SCCLK(3) applied to the output buffer 27 of the third GIP GIP(3) have phases shifted (delayed) by one clock from the carry pulse output clock signal CRCLK(2) and the scan pulse output clock signal SCCLK(2) applied to the output buffer 27 of the second GIP GIP(2).

Accordingly, since the carry pulse output clock signals and the scan pulse output clock signals shifted sequentially are applied to the first to third GIPs GIP(1), GIP(2) and GIP(3), the first to third GIPs GIP(1), GIP(2) and GIP(3) are simultaneously enabled by the gate start signal VST output from the timing controller 4, thereby sequentially outputting the carry pulses and the scan pulses.

In addition, the line selection signal LSP at a high level when the gate start signal VST is at a low level is shifted and applied similarly to the clock signal.

In addition, the carry pulse CP(5) output from the fifth GIP GIP(5) is applied to the transistors T3n and T3nA of the driving-time node controller 23 of the second GIP GIP(2) and the carry pulse CP(6) output from the sixth GIP GIP(6) is applied to the transistors T3n and T3nA of the driving-time node controller 23 of the third GIP GIP(3).

Next, the configuration of the last GIP GIP(n) will be described.

Figure 8:
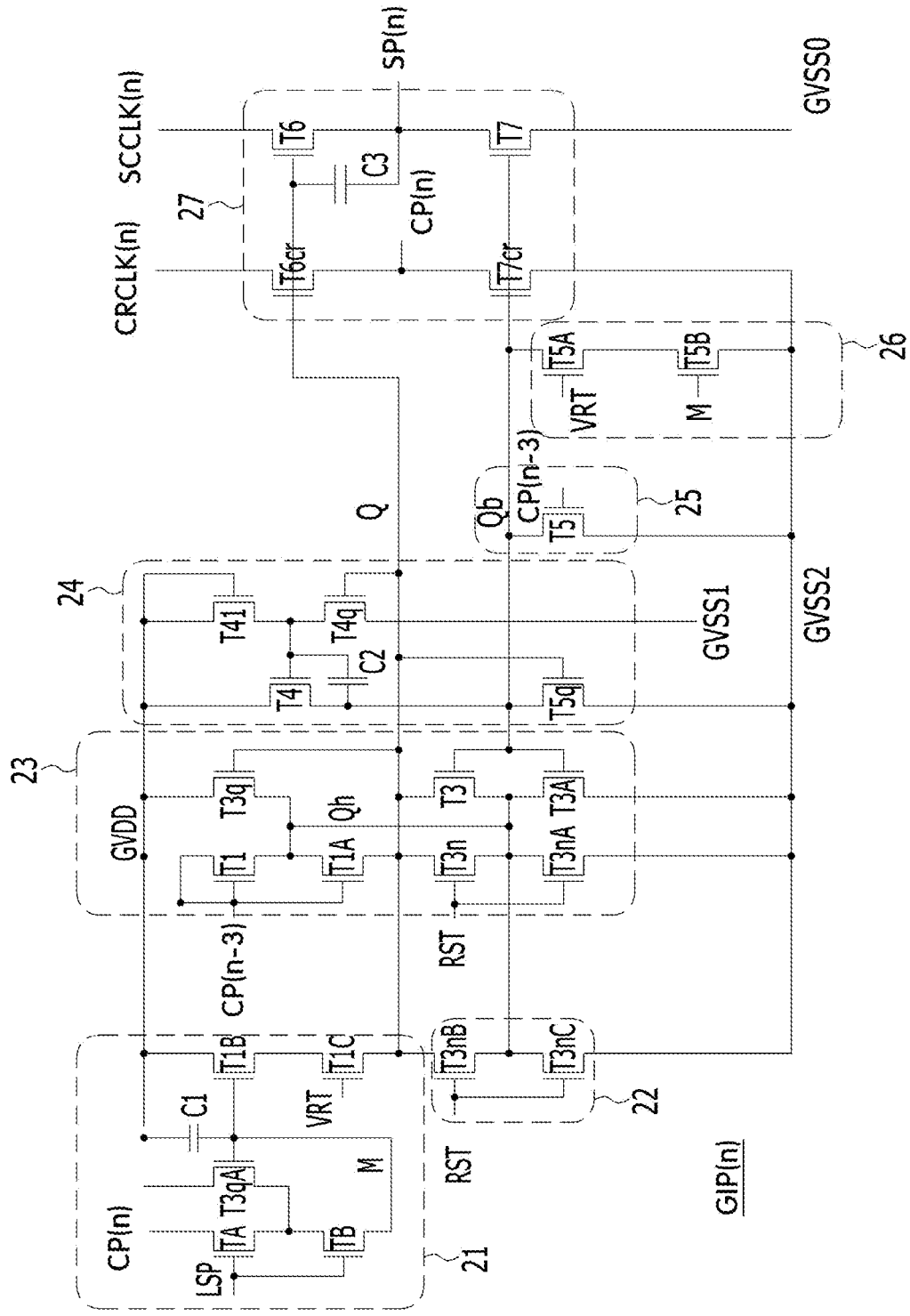
FIG. 8 is a circuit diagram of a last GIP of the gate driver according to the first embodiment of the present disclosure.
Figure 9:
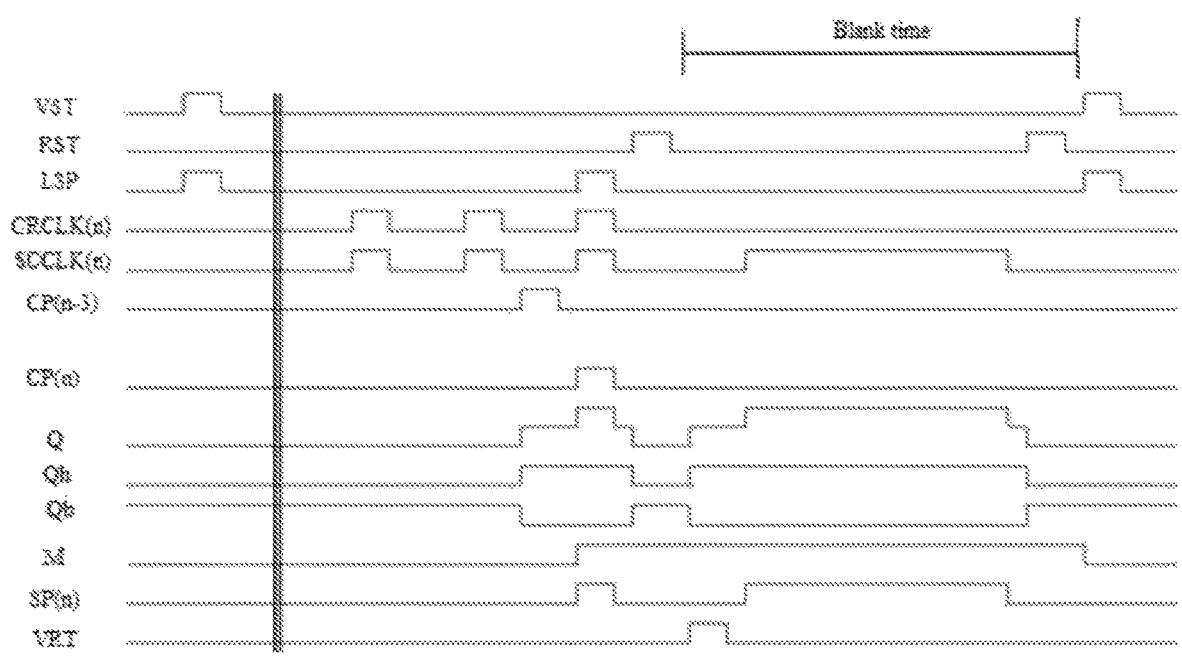
FIG. 9 is a timing chart of the operation of the GIP circuit of FIG. 8.

FIG. 8 is a circuit diagram of a last GIP of the gate driver according to the first embodiment of the present disclosure, and FIG. 9 is a timing chart of the operation of the GIP circuit of FIG. 8.

As shown in FIG. 8, the last GIP GIP(n) of the gate driver according to the first embodiment of the present disclosure has the same configuration and is driven using the same method as the first GIP GIP(1) shown in FIG. 4, except that applied signals are different.

There is a difference in the phase of the line select signal LSP applied to the blank-time node controller 21 at a high level when the gate start signal VST is at a low level, and the phase of the carry pulse output clock signal CRCLK(n) and the scan pulse output clock signal SCCLK(n) applied to the output buffer 27.

In addition, there is a difference in the signals applied to the transistors T3n and T3nA of the driving-time node controller 23.

That is, the carry pulse output clock signals CRCLK(n) and the scan pulse output clock signal SCCLK(n) applied to the output buffer 27 of the last GIP GIP(n) have different phases from the carry pulse output clock signal CRCLK(1) and the scan pulse output clock signal SCCLK(1) applied to the output buffer 27 of the first GIP GIP(1).

In addition, the line selection signal LSP at a high level when the gate start signal VST is at a low level, is shifted and applied similarly to the clock signal.

In addition, the carry pulse CP(n-3) output from the GIP GIP(n-3) of the third previous stage is applied to the transistors T1, T1A and T5 of the driving-time node controllers 23 and 25 of the last GIP GIP(n) and the reset signal RST output from the timing controller 4 is applied to the transistors T3n and T3nA of the driving-time node controllers 23 and 25.

The operation of the last GIP GIP(n) of the gate driver according to the first embodiment of the present disclosure will now be described with reference to FIG. 9.

First, as shown in FIG. 9, at the beginning of the frame in which the gate start signal VST and the line select signal LSP having a high level are simultaneously input, the transistors TA, TB and T3qA are turned on to discharge the capacitor C1, thereby performing initialization.

When the carry pulse CP(n-3) output from the GIP GIP(n-3) of the third previous stage is input in a high level state, as described above, by the driving-time node controllers 23 and 25, the first node Q is charged with the voltage of the carry pulse CP(n-3), the second node Qb is discharged with the second constant voltage GVSS2, and the third node Qh is charged with the first constant voltage GVDD. In addition, the inverter 24 inverts the voltage of the first node Q and applies the inverted voltage to the second node Qb.

Accordingly, the first node Q and the third node Qh become a high level state and the second node becomes a low level state.

In a state in which the gate start signal VST is at a low level, when the line select signal LSP having a high level is input again, the transistors TA, TB and T3qA are turned on to charge the capacitor C1 with the carry pulse CP(n). Accordingly, the M node of the blank-time node controllers 21 and 26 is maintained at a high level until a next frame starts.

When the first node Q is at a high level and the second node Qb is at a low level, the pull-up transistor T6cr of the output buffer 27 is turned on and the pull-down transistor T7cr is turned off to output one CRCLK(n) of the plurality of carry pulse output clock signals as the carry pulse CP(n) and the pull-up transistor T6 is turned on and the pull-down transistor T7 is turned off to output one SCCLK(n) of the plurality of scan pulse output clock signals as the scan pulse SP(n).

At this time, when the scan pulse output clock signal SCCLK(n) having a high level is applied, the first node Q is bootstrapped (or coupled) by the bootstrapping capacitor C3 of the output buffer 27, thereby having a higher voltage.

In a state in which the first node Q is bootstrapped, the output buffer 27 outputs the carry pulse output clock signal CRCLK(n) and the scan pulse output clock signal SCCLK(n) as the carry pulse CP(n) and the scan pulse SP(n), thereby preventing output loss.

When the reset signal RST output from the timing controller 4 is output in a high level state, the transistors T3n and T3nA of the driving-time node controller 23 are turned on to discharge the first node Q and the third node Qh with the second constant voltage GVSS2.

Accordingly, the first node Q and the third node Qh become a low level state and the second node Qb becomes a high level state.

Meanwhile, at the blank time, when the reset signal RST output from the timing controller 4 is at a high level, the transistors T3nB and T3nC of the reset unit 22 are turned on to discharge the first node Q with the second constant voltage GVSS2, thereby performing initialization. In addition, at the blank time, when the real-time compensation signal VRT is at a high level, the transistors T1c and T5B of the blank-time node controller 21 and 26 are turned on to charge the first node Q with the first constant voltage GVDD and to discharge the second node Qb with the second constant voltage GVSS2.

Accordingly, at the blank time, the first node Q becomes a high level state and the second node Qb becomes a low level state. At this time, since one SCCLK(n) of the plurality of scan pulse output clock signals is output in a high level state, the carry pulse CP(n) is not output but the scan pulse SP(n) is output. This state is maintained until the reset signal having a high level is input. When the reset signal having a high level is input, the transistors T3nB and T3nC of the reset unit 22 are turned on to discharge the first node Q with the second constant voltage GVSS2, thereby performing initialization. Therefore, the first node Q and the third node Qh become a low level state and the second node Qb becomes a high level state.

In addition, in a next frame, when the gate start signal VST and the line select signal LSP having a high level are simultaneously input, the capacitor C1 is initialized and the M node is maintained in the low level state.

By this method, real-time compensation is performed at the blank time.

Although the last GIP GIP(n) of the gate driver according to the first embodiment of the present disclosure is described in FIGS. 8 and 9, the (n-1)-th and (n-2)-th GIPs GIP(n-1) and GIP(n-2) shown in FIG. 3 have the same circuit configuration and are driven using the same method as the last GIP, except that applied signals are different.

As described above, there is a difference in the phase of the line select signal LSP applied to the blank-time node controller 21 at a high level when the gate start signal VST is at a low level, and the phase of the carry pulse output clock signal and the scan pulse output clock signal applied to the output buffer 27.

In addition, there is a difference in the carry pulses CP(n-4) or CP(n-5) applied to the transistors T1, T1A and T5 of the driving-time node controller 23 and 25.

The configuration of the remaining GIPs GIP(4) to GIP (n-3) of the gate driver according to the first embodiment of the present disclosure shown in FIG. 3 will now be described.

Figure 10:
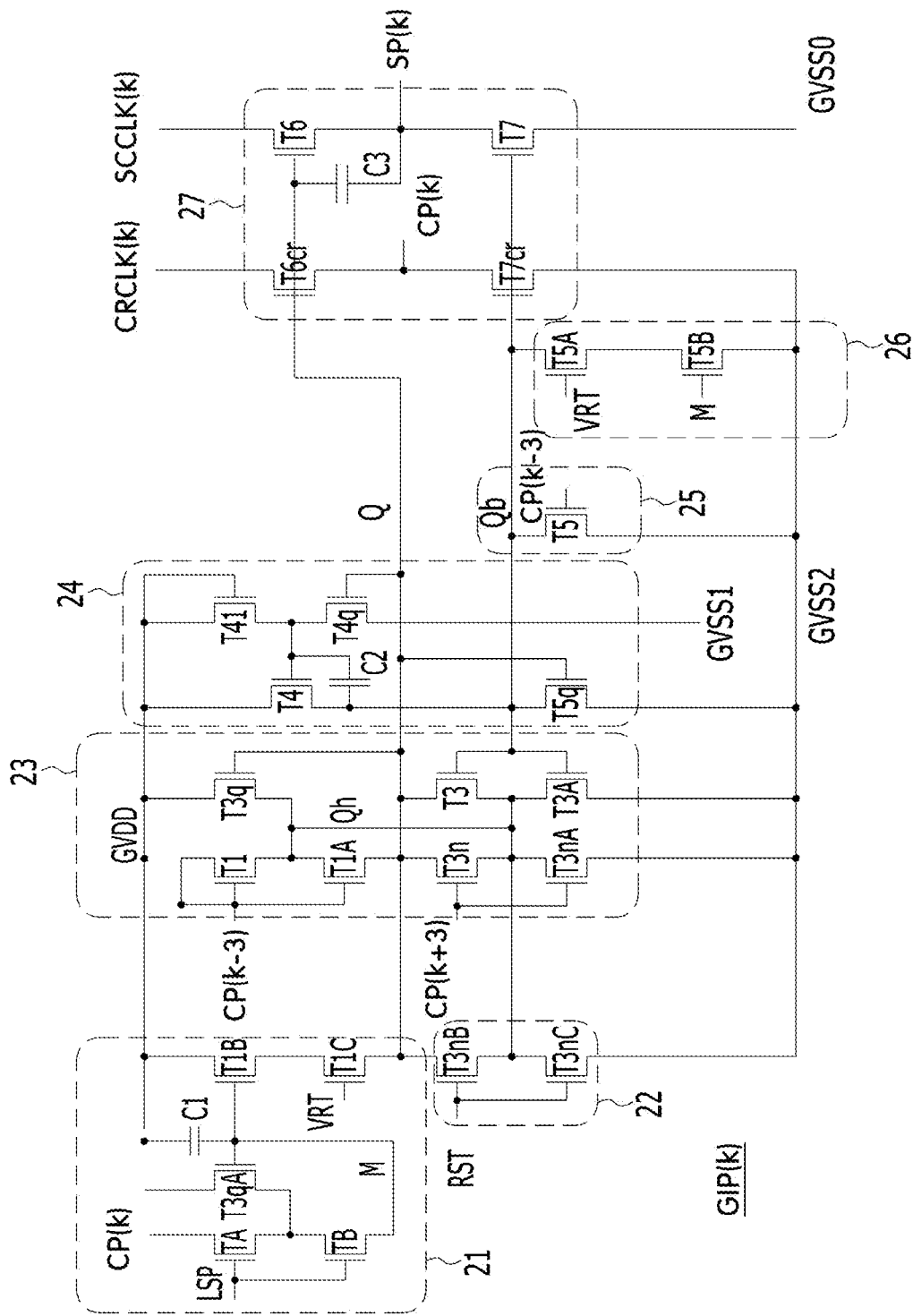
FIG. 10 is a circuit diagram of a k-th GIP of the gate driver according to the first embodiment of the present disclosure.
Figure 11:
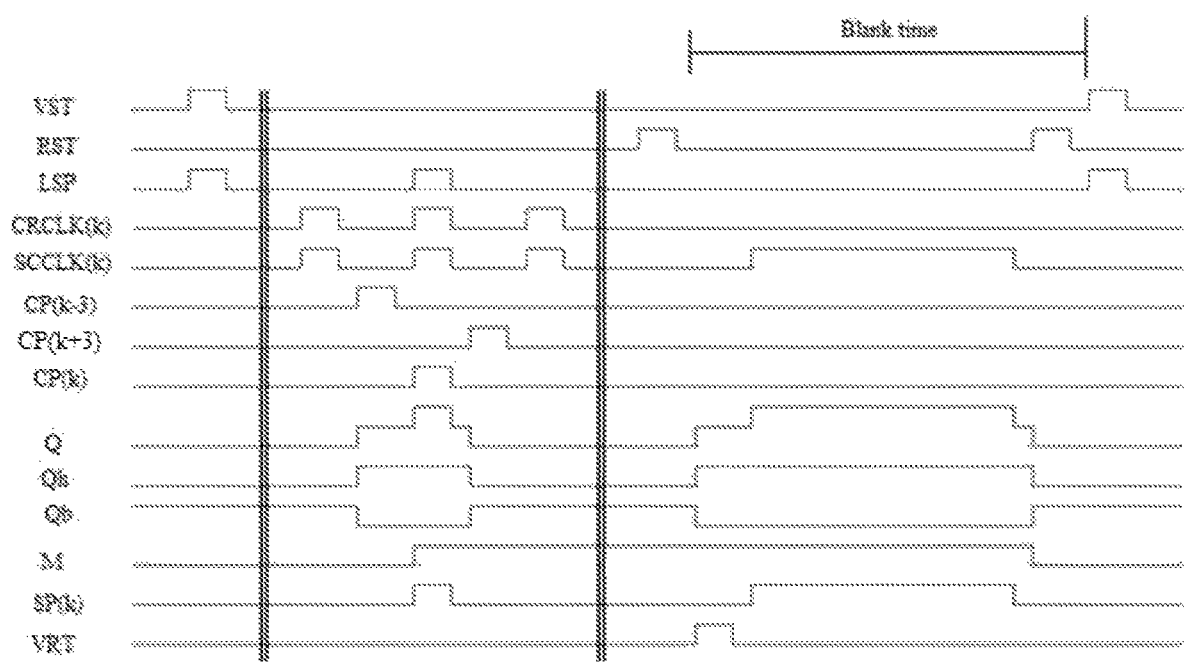
FIG. 11 is a timing chart of the operation of the GIP circuit of FIG. 10.

FIG. 10 is a circuit diagram of a k-th GIP of the gate driver according to the first embodiment of the present disclosure, and FIG. 11 is a timing chart of the operation of the GIP circuit of FIG. 10.

As shown in FIG. 10, the remaining GIPs GIP(4) to GIP(n-3) of the gate driver according to the first embodiment of the present disclosure have the same configuration and are driven using the same method as the first GIP GIP(1) shown in FIG. 4, except that applied signals are different.

That is, there is a difference in the phase of the line select signal LSP applied to the blank-time node controller 21 at a high level when the gate start signal VST is at a low level, and the phase of the carry pulse output clock signal CRCLK(k) and the scan pulse output clock signal SCCLK(k) applied to the output buffer 27.

In addition, there is a difference in the carry pulses applied to the transistors T3n and T3nA of the driving-time node controller 23.

That is, the carry pulse output clock signals CRCLK(k) and the scan pulse output clock signal SCCLK(k) applied to the output buffer 27 of the k-th GIP GIP(k) have different phases from the carry pulse output clock signal CRCLK(1) and the scan pulse output clock signal SCCLK(1) applied to the output buffer 27 of the first GIP GIP(1).

In addition, the second high level state of the line selection signal LSP is shifted and applied similarly to the clock signal.

In addition, the carry pulse CP(k-3) output from the GIP GIP(k-3) of the third previous stage is applied to the transistors T1, T1A and T5 of the driving-time node controller 23 and 25 of the k-th GIP GIP(k) and the carry pulse CP(k+3) output from the GIP GIP(k+3) of the third next stage is applied to the transistors T3n and T3nA of the driving-time node controllers 23 and 25.

The operation of the k-th GIP GIP(k) of the gate driver according to the first embodiment of the present disclosure will now be described with reference to FIG. 11.

First, as shown in FIG. 11, at the beginning of the frame in which the gate start signal VST and the line select signal LSP having a high level are simultaneously input, the transistors TA, TB and T3qA are turned on to discharge the capacitor C1, thereby performing initialization.

When the carry pulse CP(k-3) output from the GIP GIP(k-3) of the third previous stage is input in a high level state, as described above, by the driving-time node controllers 23 and 25, the first node Q is charged with the voltage of the carry pulse CP(k-3), the second node Qb is discharged with the second constant voltage GVSS2, and the third node Qh is charged with the first constant voltage GVDD. In addition, the inverter 24 inverts the voltage of the first node Q and applies the inverted voltage to the second node Qb.

Accordingly, the first node Q and the third node Qh become a high level state and the second node Qb becomes a low level state.

In a state in which the gate start signal VST is at a low level, when the line select signal LSP having a high level is input again, the transistors TA, TB and T3qA are turned on to charge the capacitor C1 with the carry pulse CP(k). Accordingly, the M node of the blank-time node controllers 21 and 26 is maintained at a high level until the next frame starts.

When the first node Q is at a high level and the second node Qb is at a low level, the pull-up transistor T6cr of the output buffer 27 is turned on and the pull-down transistor T7cr is turned off to output one CRCLK(k) of the plurality of carry pulse output clock signals as the carry pulse CP(k) and the pull-up transistor T6 is turned on and the pull-down transistor T7 is turned off to output one SCCLK(k) of the plurality of scan pulse output clock signals as the scan pulse SP(k).

At this time, when the scan pulse output clock signal SCCLK(k) having a high level is applied, the first node Q is bootstrapped (or coupled) by the bootstrapping capacitor C3 of the output buffer 27, thereby having a higher voltage.

In a state in which the first node Q is bootstrapped, the output buffer 27 outputs the carry pulse output clock signal CRCLK(k) and the scan pulse output clock signal SCCLK (k) as the carry pulse CP(k) and the scan pulse SP(k), thereby preventing output loss.

When the carry pulse CP(k+3) output from the GIP GIP(k+3) of the third next stage is output in a high level state, the transistors T3n and T3nA of the driving-time node controller 23 are turned on to discharge the first node Q and the third node Qh with the second constant voltage GVSS2.

Accordingly, the first node Q and the third node Qh become a low level state and the second node Qb becomes a high level state.

Meanwhile, at the blank time, when the reset signal RST output from the timing controller 4 is at a high level, the transistors T3nB and T3nC of the reset unit 22 are turned on to discharge the first node Q with the second constant voltage GVSS2, thereby performing initialization. In addition, at the blank time, when the real-time compensation signal VRT is at a high level, the transistors T1c and T5B of the blank-time node controller 21 and 26 are turned on to charge the first node Q with the first constant voltage GVDD and to discharge the second node with the second constant voltage GVSS2.

Accordingly, at the blank time, the first node Q becomes a high level state and the second node Qb becomes a low level state. At this time, since one SCCLK(k) of the plurality of scan pulse output clock signals is output in a high level state, the carry pulse CP(k) is not output but the scan pulse SP(k) is output. This state is maintained until the reset signal having a high level is input. When the reset signal having a high level is input, the transistors T3nB and T3nC of the reset unit 22 are turned on to discharge the first node Q with the second constant voltage GVSS2, thereby performing initialization. Therefore, the first node Q and the third node Qh become a low level state and the second node Qb becomes a high level state.

In addition, in a next frame, when the gate start signal VST and the line select signal LSP having a high level are simultaneously input, the capacitor C1 is initialized and the M node is maintained in the low level state.

By this method, real-time compensation is performed at the blank time.

In the GIPs GIP(1) to GIP(n) of the gate driver according to the first embodiment of the present disclosure, the real-time compensation signal VRT and the reset signal RST differ in enable timing at the blank time.

That is, the first nodes Q of the GIPs GIP(1) to GIP(n) of the gate driver according to the first embodiment of the present disclosure shown in FIGS. 4, 6 to 8 and 10 are charged with the first constant voltage GVDD by the real-time compensation signal VRT and are discharged with the second constant voltage by the reset signal RST, at the blank time.

Accordingly, when the real-time compensation signal VRT and the reset signal RST are simultaneously enabled (simultaneously have a high level), the first nodes Q of the GIPs GIP(1) to GIP(n) are not charged and real-time compensation is not realized at the blank time.

Therefore, as shown in FIGS. 5, 9 and 11, the real-time compensation signal VRT is delayed relative to the reset signal RST at the blank time.

Meanwhile, in the gate driver according to the first embodiment of the present disclosure described with reference to FIGS. 4 to 11, the reset unit 22 of the first GIP GIP(1) may be omitted or the reset unit 22 may be maintained and may be driven by a signal VSTP other than the reset signal RST.

Figure 12:
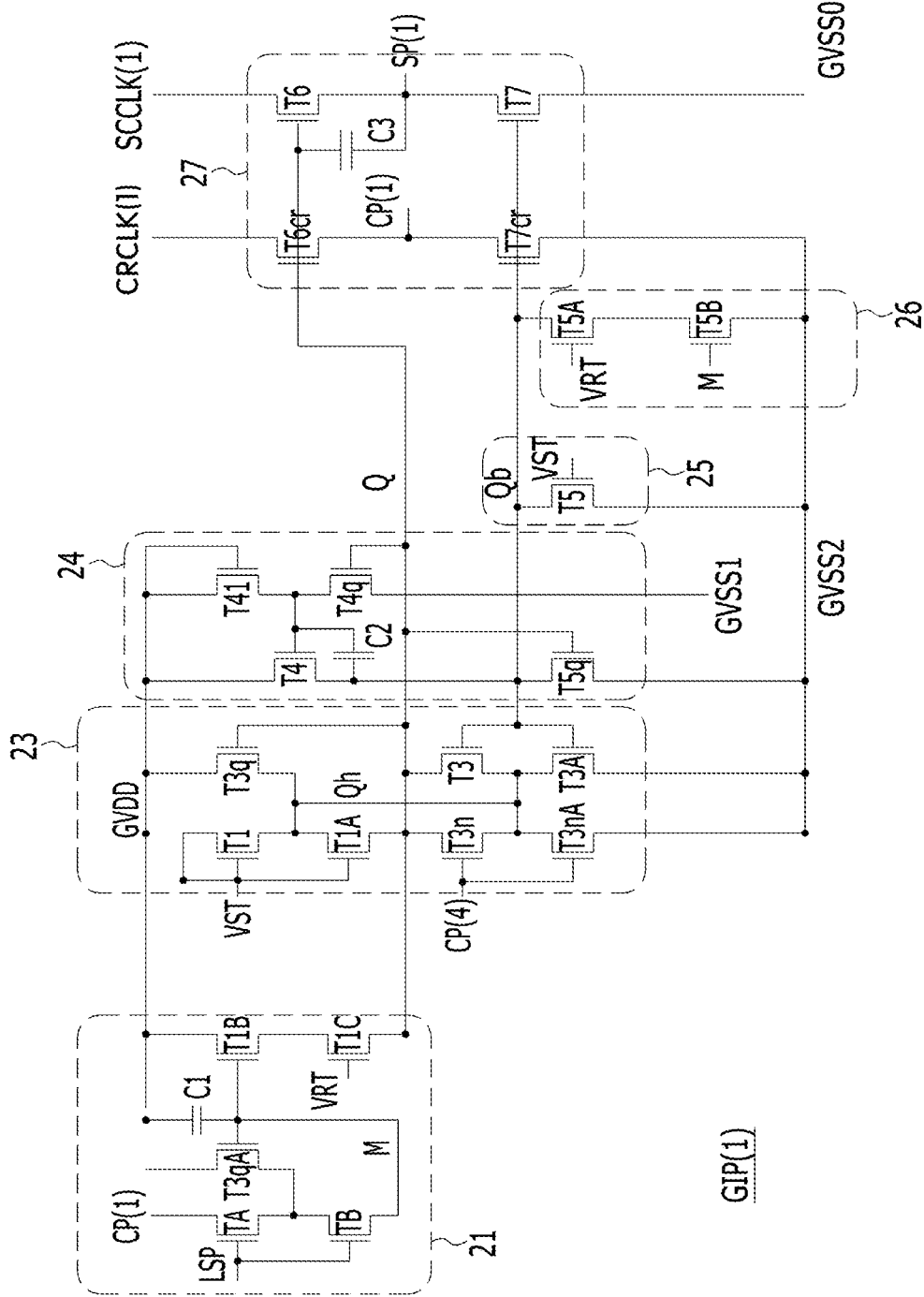
FIG. 12 is a circuit diagram of a first GIP of the gate driver according to a second embodiment of the present disclosure.
Figure 13:
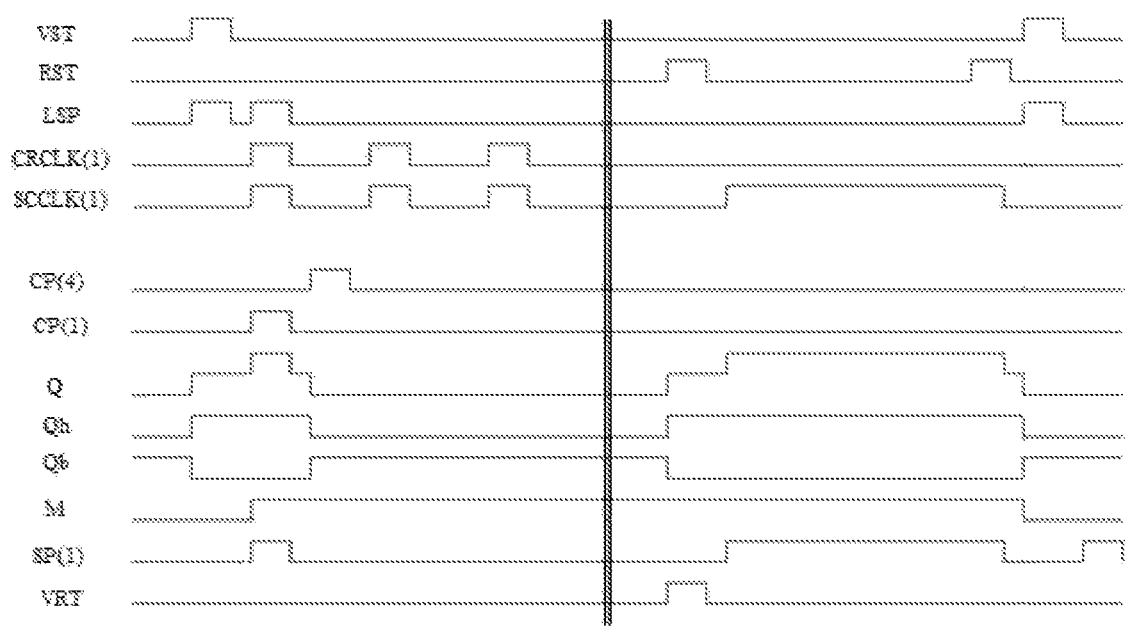
FIG. 13 is a timing chart of the operation of the GIP circuit of FIG. 12.

FIG. 12 is a circuit diagram of a first GIP of the gate driver according to a second embodiment of the present disclosure, and FIG. 13 is a timing chart of the operation of the GIP circuit of FIG. 12.

As shown in FIG. 12, the configuration of the first GIP GIP(1) of the gate driver according to the second embodiment of the present disclosure is equal to that of the first GIP GIP(1) of the gate driver according to the first embodiment of the present disclosure shown in FIG. 4, except that the reset unit 22 is omitted.

That is, as shown in FIG. 12, the first GIP GIP(1) of the gate driver according to the second embodiment of the present disclosure includes blank-time node controllers 21 and 26 including transistors TA, TB, T3qA, T1B, T1C, T5A and T5B and a capacitor C1 to selectively store a carry pulse CP(1) according to a line select signal (LSP) and to charge a first node Q of a corresponding stage with a first constant voltage GVDD and discharge a second node Qb with a second constant voltage GVSS2 according to a real-time compensation signal VRT (vertical real time) at a blank time; driving-time node controllers 23 and 25 including transistors T1, T1A, T3n, T3nA, T3q, T3, T3A and T5 to charge the first node Q of the corresponding stage with a gate start signal VST according to the gate start signal VST at a driving time, to discharge the first node Q and a third node Qh with a second constant voltage GVSS2 according to the carry pulse CP4 of the third next stage, to discharge the second node Qb with the second constant voltage GVSS2 according to the gate start signal VST, and to charge the third node Qh with the first constant voltage GVDD according to the voltage of the first node Q; an inverter 24 including transistors T4, T41, T4q and T5q and a capacitor C2 to invert the voltage of the first node Q and to apply the inverted voltage to the second node Qb; and an output buffer 27 including pull-up transistors T6cr and T6, pull-down transistors T7cr and T7 and a bootstrapping capacitor C3 to receive one CRCLK(1) of a plurality of carry pulse output clock signals and one SCCLK(1) of a plurality of scan pulse output clock signals and to output a carry pulse CP(1) and a scan pulse SP(1) according to the voltages of the first node Q and the second node Qb.

The method of driving the first GIP GIP(1) of the gate driver according to the second embodiment of the present disclosure will be described with reference FIG. 13.

FIG. 5 and FIG. 13 are different in that the real-time compensation signal VRT and the reset signal RST are simultaneously enabled (simultaneously have a high level) at the blank time.

Accordingly, the gate start signal VST, the line select signal LSP and the reset signal RST are applied in the same manner as in the first GIP GIP(1) of the gate driver according to the first embodiment of the present disclosure. Even when the real-time compensation signal VRT and the reset signal RST are simultaneously enabled (simultaneously have a high level), the first GIP GIP(1) of the gate driver according to the second embodiment of the present disclosure shown in FIG. 12 does not include the reset unit 22 and thus the first node Q of the first GIP GIP(1) can be charged.

Accordingly, in the first GIP GIP(1) of the gate driver according to the second embodiment of the present disclosure shown in FIG. 12, the real-time compensation time may be increased at the blank time as compared to the first GIP GIP(1) of the gate driver according to the first embodiment of the present disclosure shown in FIG. 4.

Although the first GIP GIP(1) of the gate driver according to the second embodiment of the present disclosure is described with reference to FIGS. 12 and 13, the second and third GIPs GIP(2) and GIP(3) of the gate driver according to the second embodiment of the present disclosure have the same configuration and are driven using the same method as the first GIP.

That is, as shown in FIGS. 6 and 7, there is a difference in the phase of the line select signal LSP applied to the blank-time controller 21 at a high level when the gate start signal VST is at a low level, and the phase of the carry pulse output clock signal CRCLK(1) and the scan pulse output clock signal SCCLK(1) applied to the output buffer 27 and there is a difference in the carry pulses of the next stages applied to the transistors T3n and T3nA of the driving-time node controller 23.

The configuration and operation of the last three GIPs GIP(n-2), GIP(n-1) and GIP(n) and the remaining GIPs GIP(4) to GIP(n-3) of the gate driver according to the second embodiment of the present disclosure are equal to those of the first embodiment, except that the reset unit 22 is driven by the reset signal RST in the first embodiment of the present disclosure, but the reset unit 22 is driven by the gate start signal VST in the second embodiment of the present disclosure.

Figure 14:
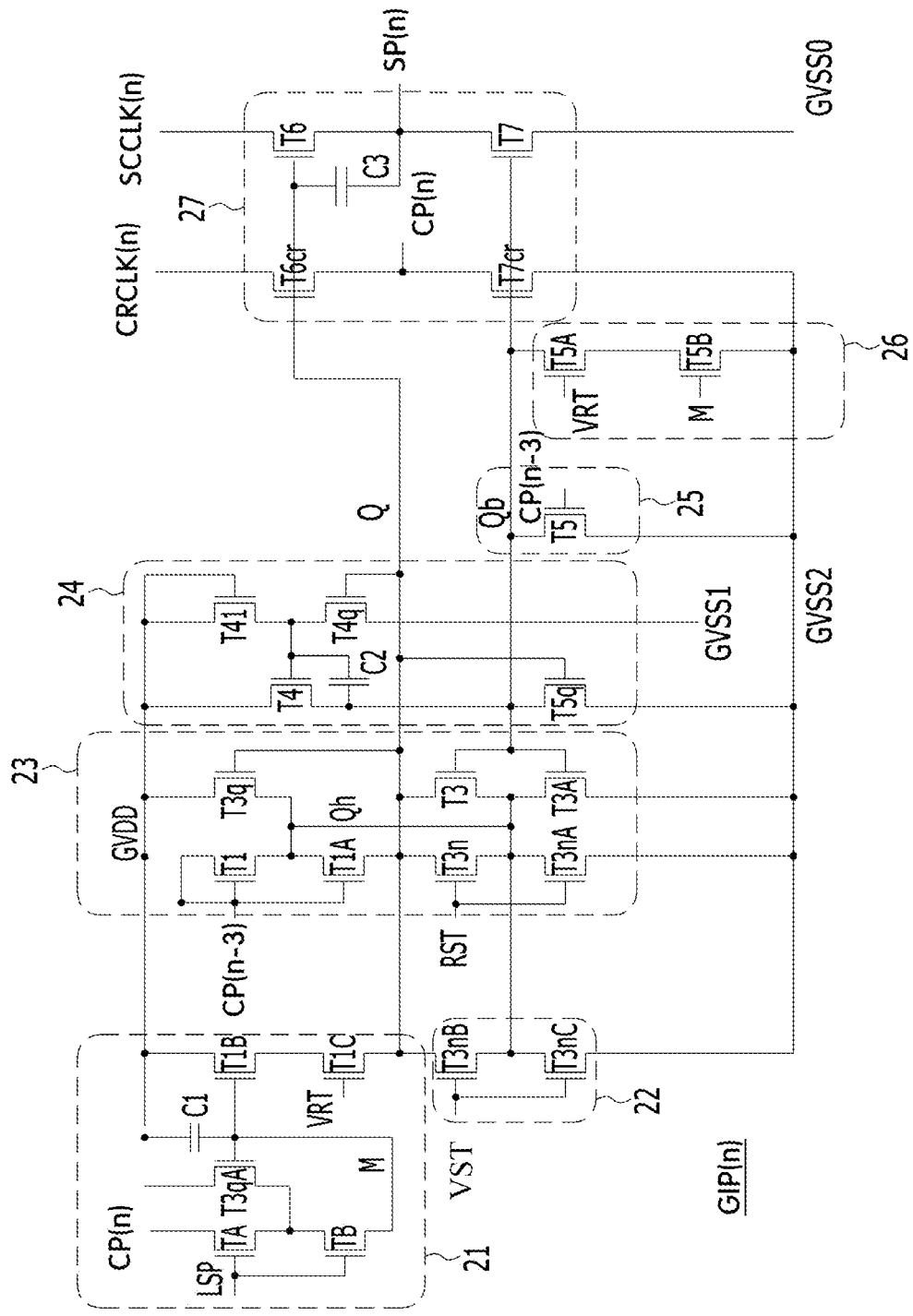
FIG. 14 is a circuit diagram of a last GIP of the gate driver according to the second embodiment of the present disclosure.

FIG. 14 is a circuit diagram of a last GIP of the gate driver according to the second embodiment of the present disclosure.

As shown in FIG. 14, the last GIP GIP(n) of the gate driver according to the second embodiment of the present disclosure has the same configuration and is driven using the same method as the last GIP GIP(n) of the gate driver according to the first embodiment of the present disclosure shown in FIG. 8, except that signals applied to the reset unit 22 are different.

That is, the reset unit 22 discharges the first node Q with the second constant voltage GVSS2 according to the gate start signal VST output from the timing controller 4.

In addition, although the last GIP GIP(n) of the gate driver according to the second embodiment of the present disclosure is described in FIG. 14, the (n-1)-th and (n-2)th GIPs GIP(n-1) and GIP(n-2) shown in FIG. 3 have the same configuration and are driven using the same method as the last GIP, except that applied signals are different.

Figure 15:
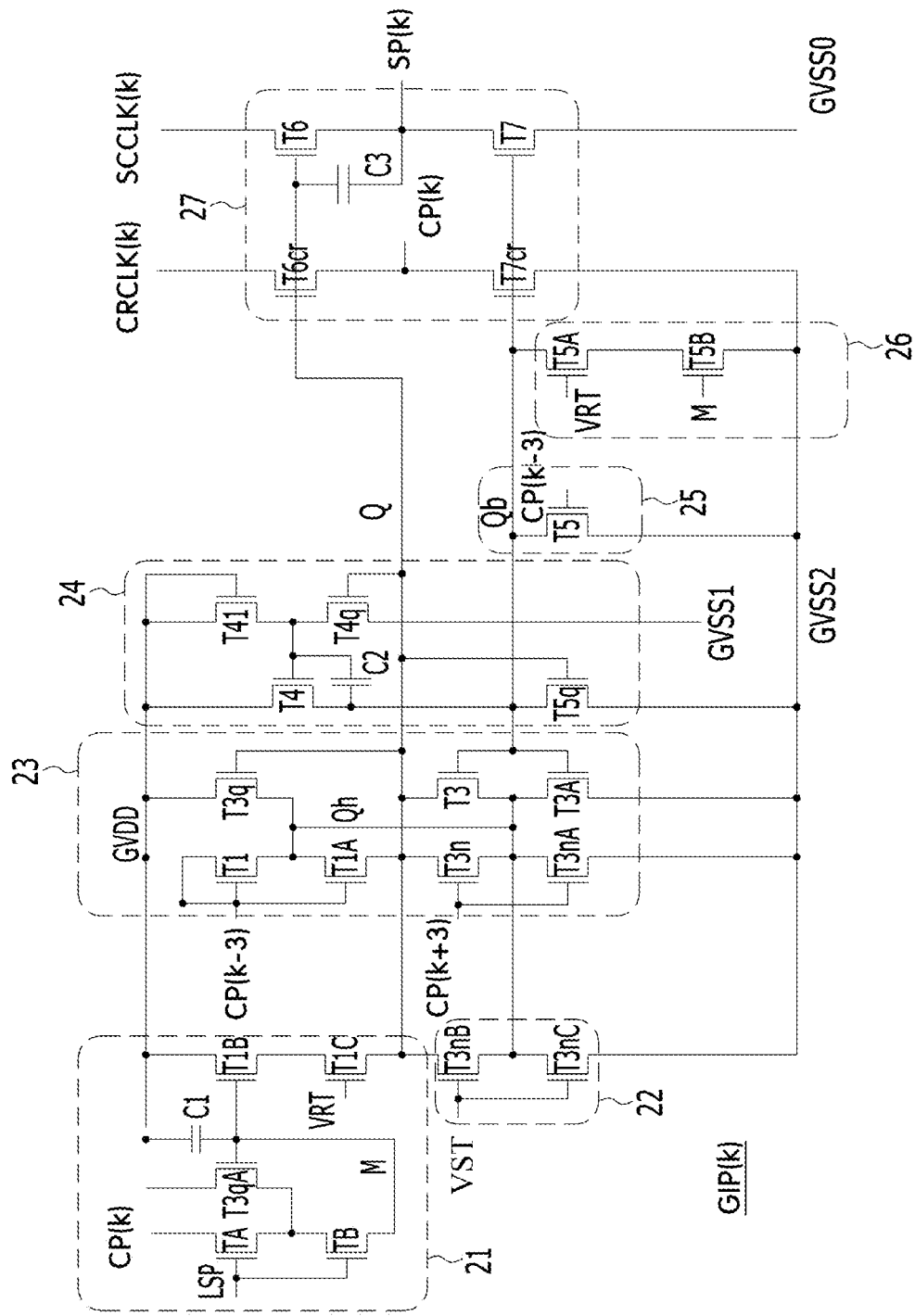
FIG. 15 is a circuit diagram of a k-th GIP of the gate driver according to the second embodiment of the present disclosure.

FIG. 15 is a circuit diagram of a k-th GIP of the gate driver according to the second embodiment of the present disclosure.

As shown in FIG. 15, the k-th GIP GIP(k) of the gate driver according to the second embodiment of the present disclosure has the same configuration and is driven using the same method as the k-th GIP(k) according to the first embodiment of the present disclosure shown in FIG. 10 except that signals applied to the reset unit 22 are different.

That is, the reset unit 22 discharges the first node Q with the second constant voltage GVSS2 according to the start signal VST output from the timing controller 4. As described above, since the dummy GIPs are not formed in the gate drivers according to the first and second embodiments of the present disclosure, it is possible to reduce the upper and lower bezels of the display device.

In addition, since the gate driver according to the first embodiment of the present disclosure can adjust the timings of the applied signals and equally configure the circuit configurations of all GIPs, it is possible to reduce a difference between GIPs.

In addition, in the gate driver according to the second embodiment of the present disclosure, since the first GIP and the remaining GIPs are different in circuit configuration but the enable timings of the real-time compensation signal VRT and the reset signal RST are equal at the blank time, the real-time compensation time can be increased at the blank time.

The present disclosure is not limited to the above-described embodiments and the accompanying drawings. Those skilled in the art will appreciate that various substitutions, modifications and variations are possible without departing from the technical scope and spirit of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driver, comprising:
a plurality of gate in panel (GIP) stages configured to sequentially supply scan pulses to a plurality of gate lines of a display panel, the plurality of GIP stages being equal in number to the plurality of gate lines, the plurality of GIP stages including:
a first set of GIP stages including a first GIP stage to a (n)-th GIP stage which are enabled by a gate start signal output from a timing controller;
a second set of GIP stages including a (m−n−1)th GIP stage to a (m)-th GIP stage which are disabled by a reset signal output from the timing controller; and
a third set of GIP stages between the first set of GIP stages and the second set of GIP stages, wherein a (k)-th GIP stage among the third set of GIP stages is enabled by a carry pulse output from a (k−n)-th GIP stage and is disabled by a carry pulse output from a (k+n)-th GIP stage, wherein n is natural number of 2 or more, k is natural number greater than n and less than (m−n−1), and the (m)-th GIP stage is a last stage.

2. The gate driver according to claim 1, wherein each of the plurality of GIP stages comprises:
an output buffer configured to receive one of a plurality of carry pulse output clock signals and one of a plurality of scan pulse output clock signals and to output a carry pulse and a scan pulse according to voltages of a first node and a second node of the corresponding GIP stage.

3. The gate driver according to claim 2, wherein at least one of the first set of GIP stages comprises:
a driving-time node controller configured to:
charge the first node and discharge the second node according to the gate start signal to enable the at least one first GIP stage, and
discharge the first node and charge the second node according to a carry pulse output from a n-th next GIP stage to disable the at least one first GIP stage, at a driving time.

4. The gate driver according to claim 2, wherein each GIP stage of the first set of GIP stages comprises:
a driving-time node controller configured to:
charge the first node and discharge the second node according to the gate start signal to enable the first set of GIP stages, and
discharge the first node and charge the second node according to a carry pulse output from a n-th next GIP stage to disable the respective first set of GIP stages at a driving time.

5. The gate driver according to claim 2, wherein at least one of the second set of GIP stages comprises:
a driving-time node controller configured to:
charge the first node and discharge the second node according to a carry pulse output from a n-th previous GIP stage to enable the at least one of the second set of GIP stages, and
discharge the first node and charge the second node according to the reset signal to disable the at least one of the second set of GIP stages, at a driving time.

6. The gate driver according to claim 2, wherein each of the second set of GIP stages comprises:
a driving-time node controller configured to:
charge the first node and discharge the second node according to a carry pulse output from a n-th previous GIP stage to enable the second set of GIP stages, and
discharge the first node and charge the second node according to the reset signal to disable the second set of GIP stages, at a driving time.

7. The gate driver according to claim 2, wherein the k-th GIP stage comprises:
a driving-time node controller configured to:
charge the first node and discharge the second node according to the carry pulse output from the (k−n)-th GIP stage to enable the k-th GIP stage, and
discharge the first node and charge the second node according to the carry pulse output from the (k+n)-th GIP stage to disable the k-th GIP stage, at a driving time.

8. The gate driver according to claim 2, wherein each of the plurality of GIP stages further comprises:
a blank-time node controller configured to:
selectively store a carry pulse output from the output buffer of the corresponding GIP stage according to a line select signal, and
charge the first node and discharge the second node according to a real-time compensation signal at a blank time in order to perform real-time compensation.

9. The gate driver according to claim 8, wherein each of the plurality of GIP stages further comprises:
a reset unit configured to discharge the first node according to the reset signal output from the timing controller at the blank time.

10. The gate driver according to claim 9, wherein an enable timing of the real-time compensation signal is delayed relative to enable timing of the reset signal at the blank time.

11. The gate driver according to claim 8, wherein the reset signal and the real-time compensation signal output to each of the first set of GIP stages are simultaneously enabled at the blank time.

12. The gate driver according to claim 11, wherein remaining GIP stages of the plurality of GIP stages except the first set of GIP stages each comprises:
   a reset unit configured to discharge the first node according to the gate start signal output from the timing controller at the blank time.

13. A flat panel display device, comprising:
   a display panel including a plurality of gate lines, a plurality of data lines, and a plurality of sub-pixels formed in a matrix to supply data voltages to the plurality of data lines in response to scan pulses supplied to the gate lines to display an image;
   a gate driver for sequentially supplying the scan pulses to the plurality of gate lines;
   a data driver for supplying the data voltages to the plurality of data lines; and
   a timing controller for respectively supplying a plurality of gate control signals and a plurality of data control signals to the gate driver and the data driver, wherein the gate driver includes a plurality of gate in panel (GIP) stages equal in number to the plurality of gate lines, and
the plurality of GIP stages includes:
a first set of GIP stages including a first GIP stage to a (n)-th GIP stage which are enabled by a gate start signal output from the timing controller;
a second set of GIP stages including a (m−n−1)th GIP stage to a (m)-th GIP stage which are disabled by a reset signal output from the timing controller; and
a third set of GIP stages between the first set of GIP stages and the second set of GIP stages, wherein a (k)-th GIP stage among the third set of GIP stages is enabled by a carry pulse output from a (k−n)-th GIP stage and is disabled by a carry pulse output from a (k+n)-th GIP stage, wherein n is natural number of 2 or more, k is natural number greater than n and less than (m−n−1), and the (m)-th GIP stage is a last stage.

* * * * *